(12) United States Patent
Gu et al.

(10) Patent No.: US 11,437,490 B2
(45) Date of Patent: Sep. 6, 2022

(54) METHODS OF FORMING A REPLACEMENT GATE STRUCTURE FOR A TRANSISTOR DEVICE

(71) Applicant: GLOBALFOUNDRIES U.S. Inc., Santa Clara, CA (US)

(72) Inventors: Sipeng Gu, Clifton Park, NY (US); Haiting Wang, Clifton Park, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/843,262

(22) Filed: Apr. 8, 2020

(65) Prior Publication Data

US 2021/0320189 A1 Oct. 14, 2021

(51) Int. Cl.
| | |
|---|---|
| *H01L 29/66* | (2006.01) |
| *H01L 21/311* | (2006.01) |
| *H01L 29/51* | (2006.01) |
| *H01L 21/02* | (2006.01) |
| *H01L 29/34* | (2006.01) |

(52) U.S. Cl.
CPC .. *H01L 29/66545* (2013.01); *H01L 21/02167* (2013.01); *H01L 21/31144* (2013.01); *H01L 29/34* (2013.01); *H01L 29/515* (2013.01); *H01L 29/6656* (2013.01); *H01L 29/66795* (2013.01)

(58) Field of Classification Search
CPC ........... H01L 29/66545; H01L 29/6656; H01L 29/66795
See application file for complete search history.

(56) References Cited

U.S. PATENT DOCUMENTS

| | | | |
|---|---|---|---|
| 7,939,392 B2 | 5/2011 | Chung et al. | |
| 7,977,181 B2 | 7/2011 | Lai et al. | |
| 9,412,666 B2 | 8/2016 | Chen et al. | |
| 9,634,005 B2 | 4/2017 | Basker et al. | |
| 9,922,886 B2* | 3/2018 | Cheng | H01L 29/161 |
| 10,763,363 B2* | 9/2020 | Lin | H01L 27/0924 |
| 10,950,731 B1* | 3/2021 | Peng | H01L 29/6656 |
| 2013/0288471 A1* | 10/2013 | Chi | H01L 21/823468 |
| | | | 438/586 |
| 2016/0049427 A1* | 2/2016 | Zang | H01L 21/76829 |
| | | | 257/347 |
| 2016/0111518 A1* | 4/2016 | Chang | H01L 29/6656 |
| | | | 257/401 |
| 2017/0092735 A1* | 3/2017 | Hashemi | H01L 29/66795 |

(Continued)

OTHER PUBLICATIONS

Qin et al., Study on the Polishing Performance of Silicon Carbonitride (SiCN), ECS Transactions, 72:73-80, 2016.

*Primary Examiner* — Bac H Au
(74) *Attorney, Agent, or Firm* — Francois Pagette; Hoffman Warnick LLC

(57) ABSTRACT

One illustrative IC product disclosed herein includes a transistor device formed on a semiconductor substrate, the transistor device comprising a gate structure comprising an upper surface, a polish-stop sidewall spacer positioned adjacent the gate structure, wherein, at a location above an upper surface of the semiconductor substrate, when viewed in a cross-section taken through the first polish-stop sidewall spacer in a direction corresponding to a gate length direction of the transistor, an upper surface of the gate structure is substantially coplanar with an upper surface of the polish-stop sidewall spacer.

14 Claims, 30 Drawing Sheets

(56) References Cited

U.S. PATENT DOCUMENTS

| | | | |
|---|---|---|---|
| 2019/0237543 A1* | 8/2019 | Tsai | H01L 21/02636 |
| 2019/0273147 A1* | 9/2019 | Cheng | H01L 21/76877 |
| 2019/0371933 A1* | 12/2019 | Chen | H01L 29/41791 |
| 2019/0378927 A1* | 12/2019 | Lin | H01L 29/66795 |
| 2020/0020567 A1* | 1/2020 | Sun | H01L 21/266 |
| 2020/0098886 A1* | 3/2020 | Liu | H01L 29/6653 |
| 2020/0235209 A1* | 7/2020 | Reznicek | H01L 29/167 |
| 2020/0411384 A1* | 12/2020 | Chung | H01L 29/6653 |
| 2021/0028297 A1* | 1/2021 | Yao | H01L 29/775 |
| 2021/0082756 A1* | 3/2021 | Tsai | H01L 29/6653 |
| 2021/0119010 A1* | 4/2021 | Yeong | H01L 29/7851 |
| 2021/0126122 A1* | 4/2021 | Ando | H01L 29/785 |
| 2021/0225766 A1* | 7/2021 | You | H01L 29/66795 |

* cited by examiner

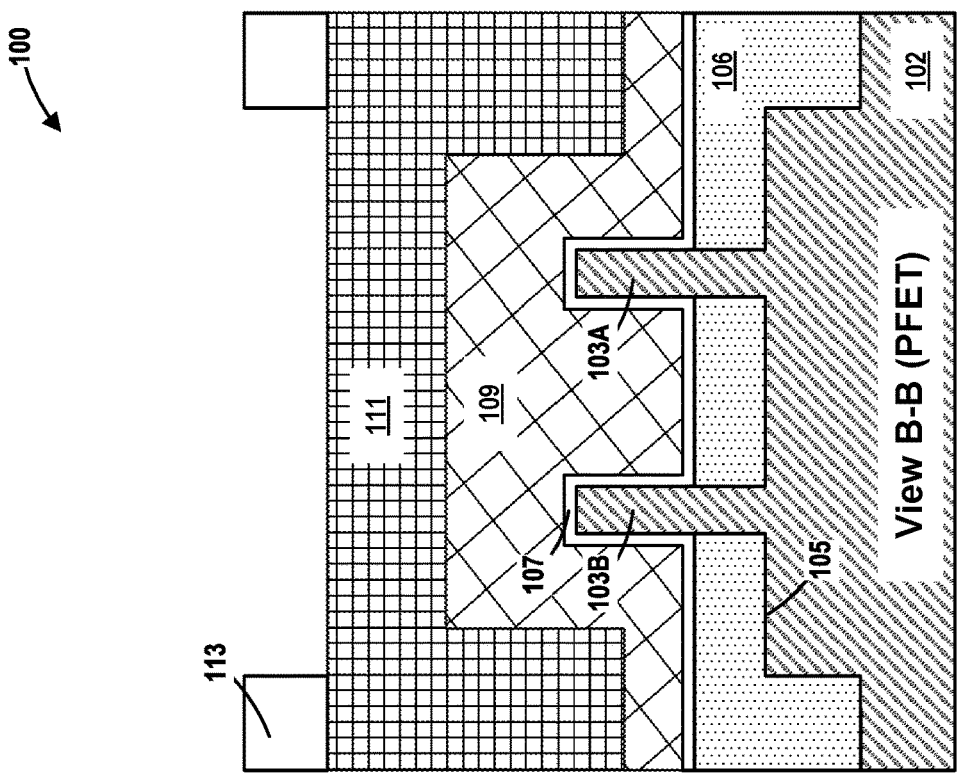
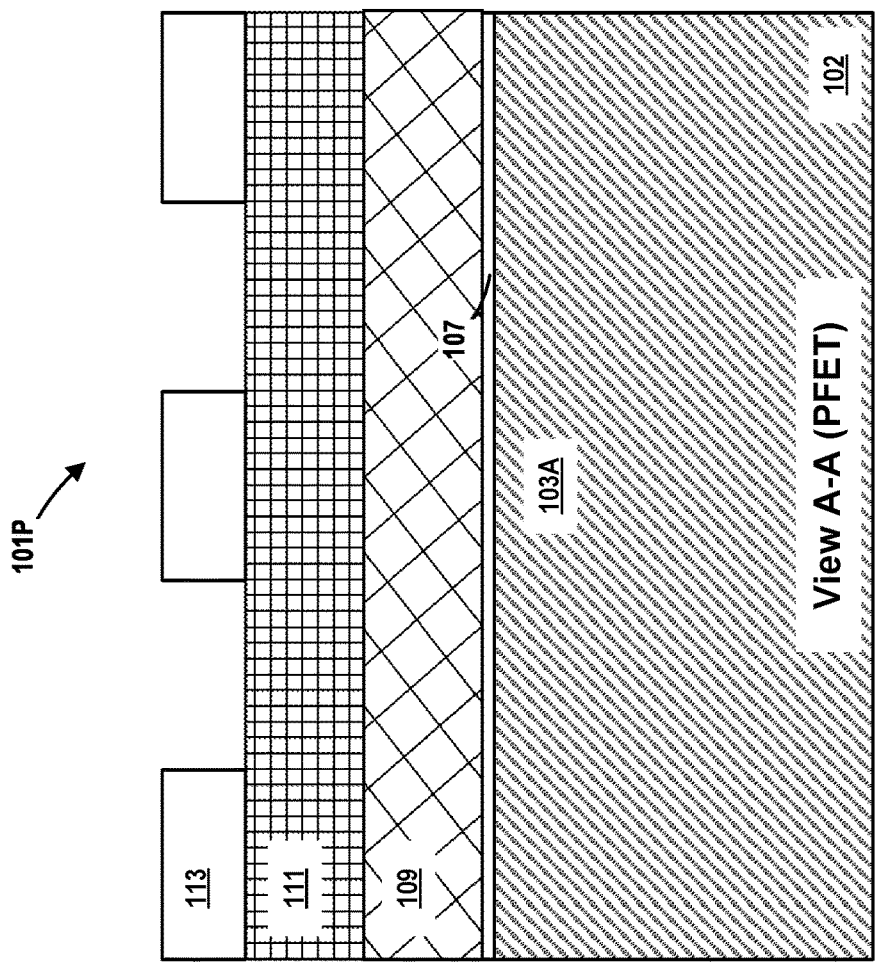

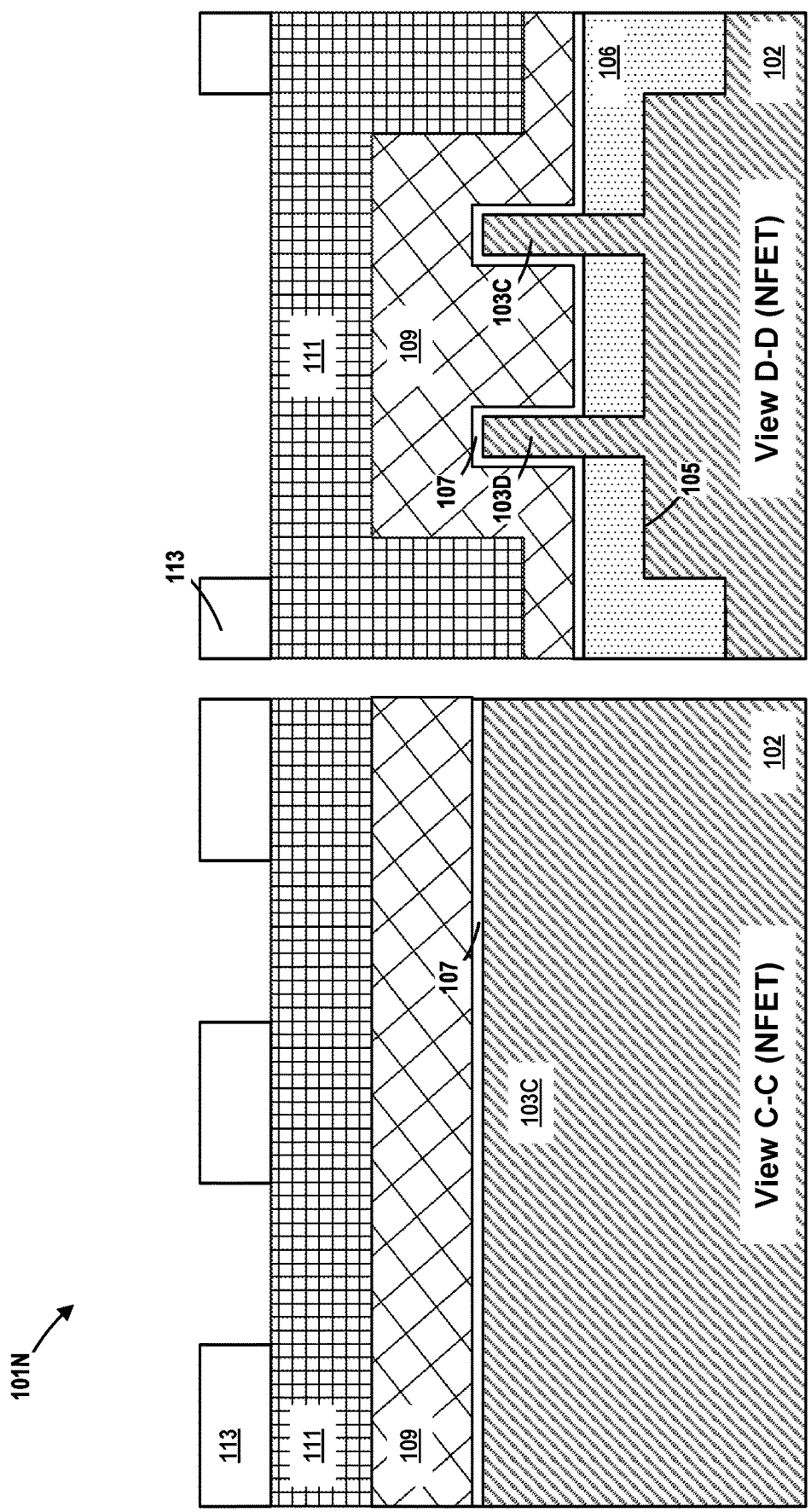

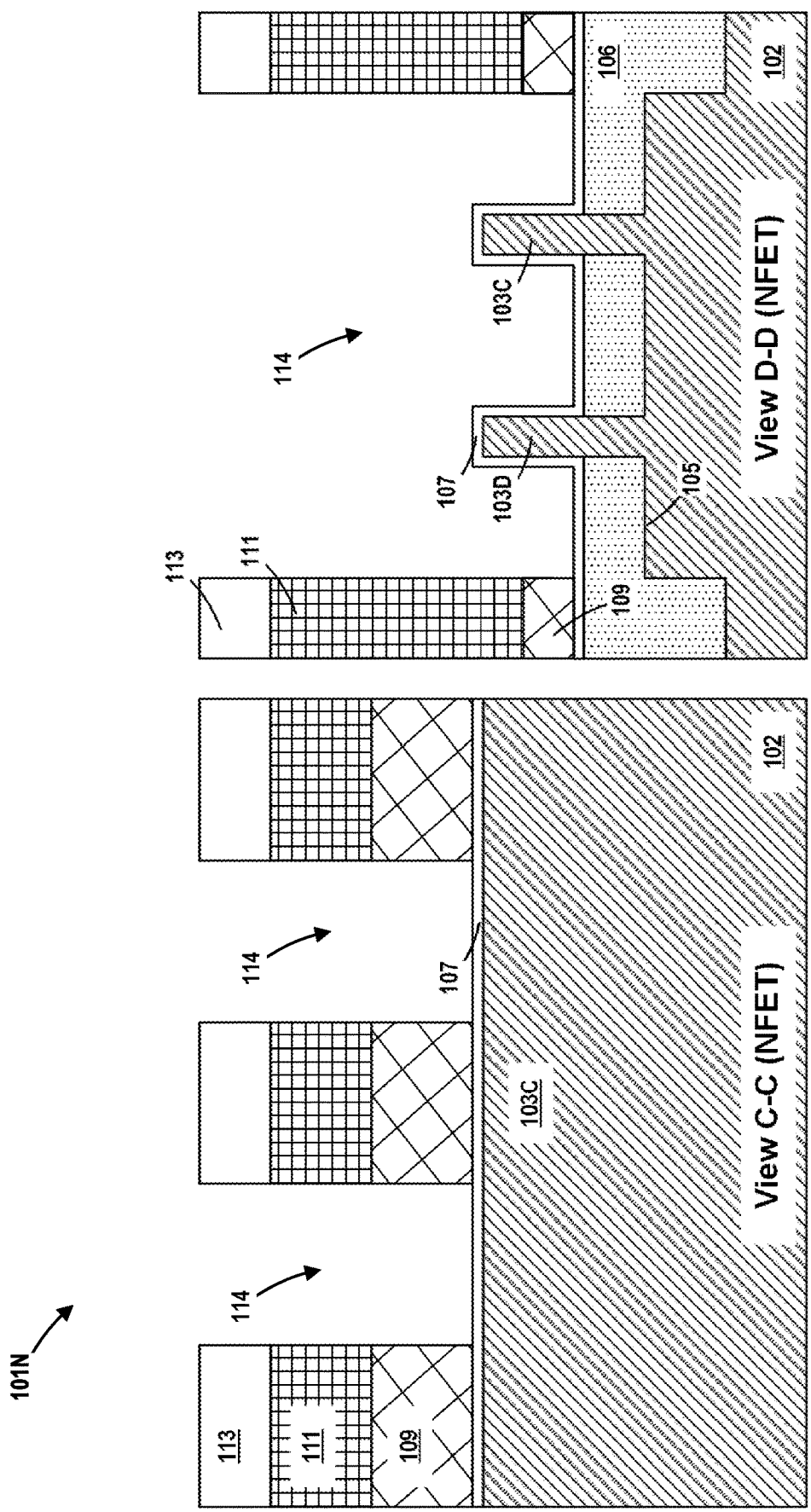

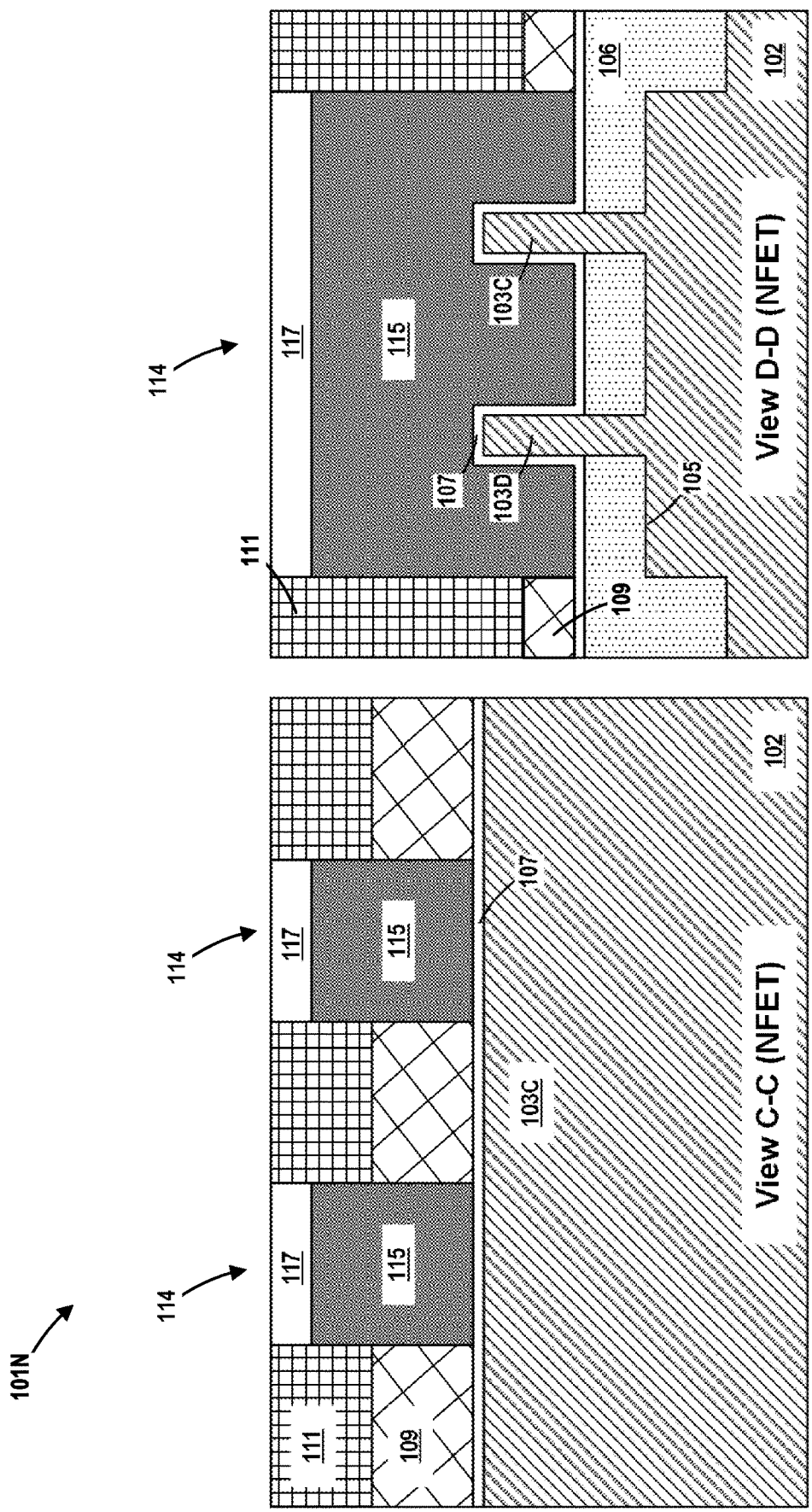

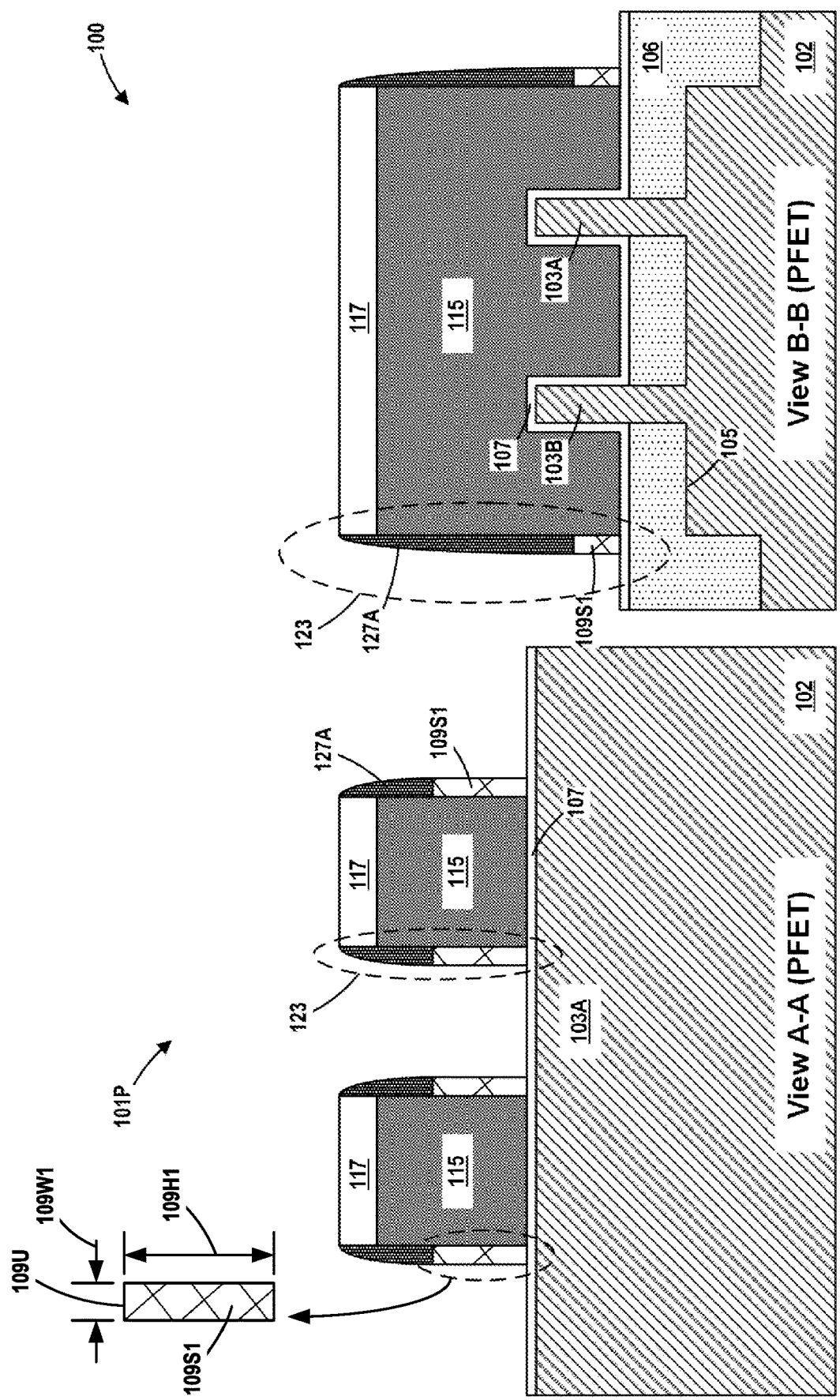

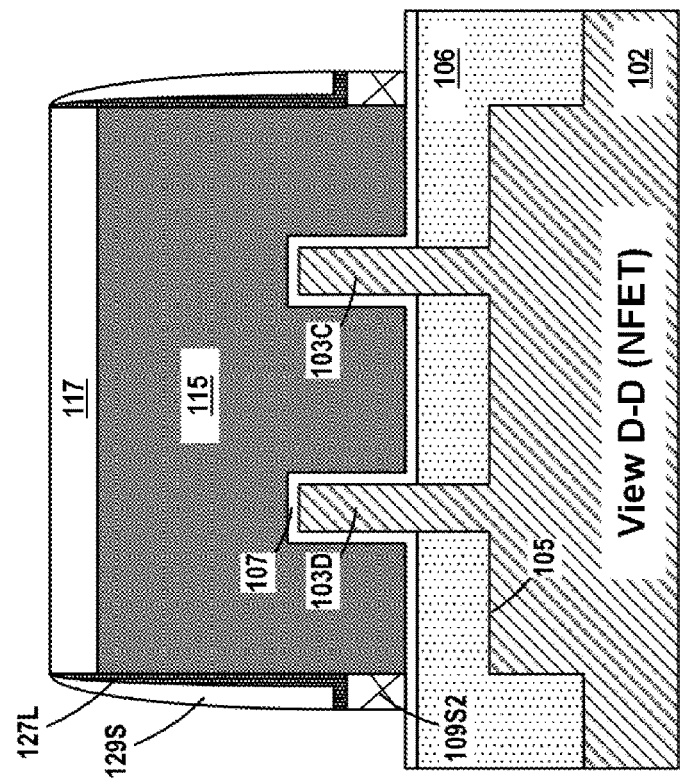
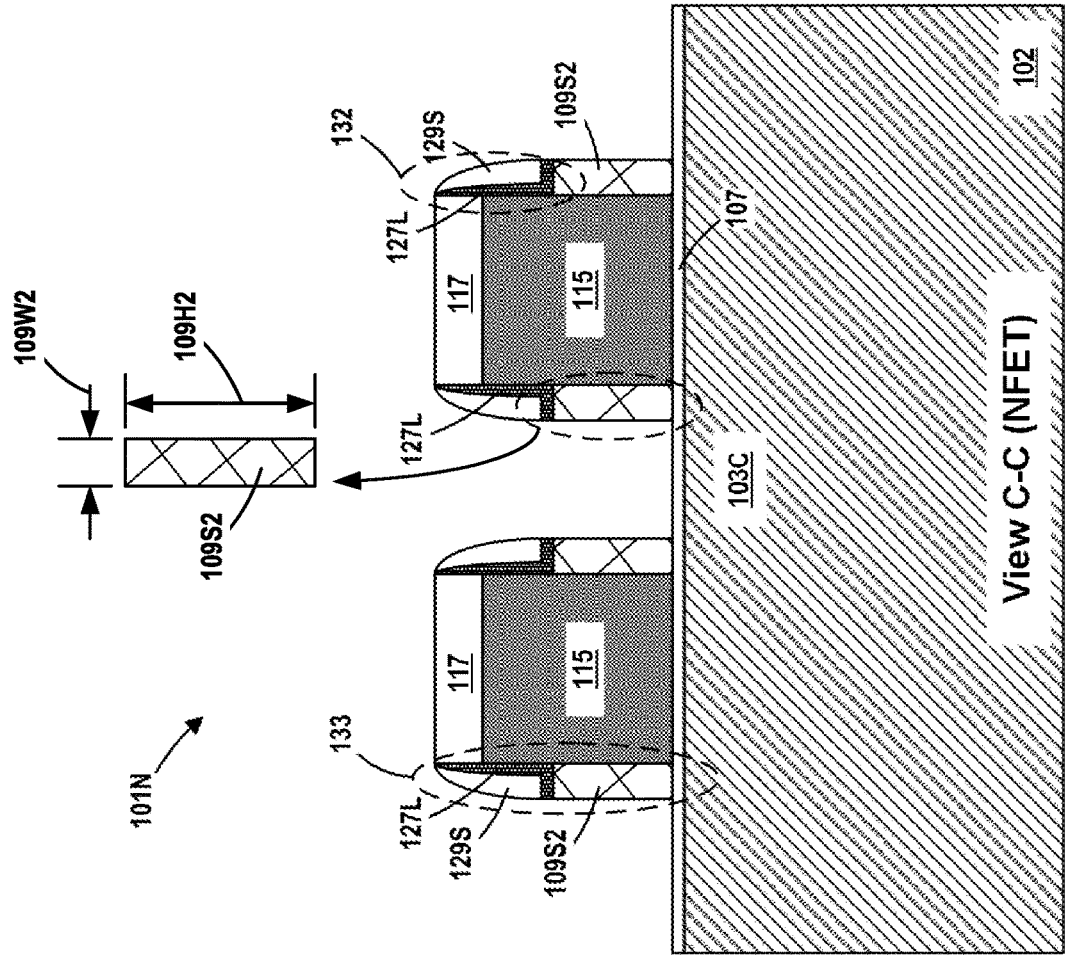
Fig. 41
Fig. 40

METHODS OF FORMING A REPLACEMENT GATE STRUCTURE FOR A TRANSISTOR DEVICE

BACKGROUND OF THE INVENTION

Field of the Invention

The present disclosure generally relates to the fabrication of integrated circuits, and, more particularly, to various novel methods of forming a replacement gate structure for a transistor device and various novel embodiments of an integrated circuit (IC) product comprising such transistor devices.

Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NFET or PFET type devices wherein the "N" and "P" designation is based upon the type of dopants used to create the source/drain regions of the devices.

The gate structures of many advanced transistor devices are formed by performing known replacement-gate manufacturing techniques, wherein a so-called "dummy" or sacrificial gate structure, including a sacrificial gate cap layer, is formed above the substrate by depositing layers of material and thereafter patterning those layers of material to define line-type structures across the substrate. Thereafter, sidewall spacers are formed adjacent the patterned sacrificial gate structure/sacrificial gate cap. The dummy gate structure remains in place as many process operations are performed to form the device, e.g., the formation of raised, doped source/drain regions, performing an anneal process to repair damage to the substrate caused by the ion implantation processes and to activate the implanted dopant materials. At some point in the process flow, the sacrificial gate cap is removed by performing a chemical mechanical polishing (CMP) process relative to a layer of insulating material so as to expose the dummy gate structure for further processing. Thereafter, one or more etching processes are performed to remove the dummy gate structure which results in the formation of a gate cavity that is laterally defined by the spacer where the final gate structure for the device will be formed. For example, after the dummy gate structure is removed, various deposition processes were performed to form the materials of the final gate structure in the gate cavity and above the upper surface of the layer of insulating material. Next, one or more CMP process operations are then performed to remove excess portions of the deposited layers of material for the final gate structure that are positioned outside the gate cavity.

As described above, the final CMP process operation essentially defines the vertical height of the final gate structures. Unfortunately, CMP process operations are not uniform across an area and, as a result, there can be significant variations in the final height of the final gate structures, which can lead to significant device and yield performance deficiencies and later processing problems that have to account for such variations in gate height. The variations in the CMP process operation may vary from CMP tool to CMP tool. For example, one CMP tool may have a polishing profile where it removes more material toward the center of the wafer and less material at the edge of the wafer—a "center-fast, edge-slow" polishing profile. Yet another processing tool may have just the opposite polishing profile—a "center-slow, edge-fast" polishing profile—whereby more material is removed from areas near the edge of the wafer as compared to areas near the center of the wafer. Additionally, the polishing profile may not be uniform across the substrate, e.g., there may be localized regions where polishing variations occur. Such CMP variations occur on a lot-to-lot basis, a wafer-to-wafer basis and on a within wafer basis, thereby leading to corresponding variations in the gate height of the final gate structures on a similar basis.

The present disclosure is generally directed to various novel methods of forming a replacement gate structure for a transistor device and various novel embodiments of an IC product comprising such transistor devices that may at least reduce one or more of the problems identified above.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming a replacement gate structure for a transistor device and various novel embodiments of an IC product comprising such transistor devices. One illustrative IC product disclosed herein includes a transistor device formed on a semiconductor substrate, the transistor comprising a gate structure comprising an upper surface, a polish-stop sidewall spacer positioned adjacent the gate structure, wherein, at a location above an upper surface of the semiconductor substrate, when viewed in a cross-section taken through the first polish-stop sidewall spacer in a direction corresponding to a gate length direction of the transistor, an upper surface of the gate structure is substantially coplanar with an upper surface of the polish-stop sidewall spacer.

One illustrative method disclosed herein includes forming at least one layer of material above a semiconductor substrate, forming a sacrificial gate cavity in the at least one layer of material, forming at least a sacrificial gate electrode in the sacrificial gate cavity and forming a sacrificial gate cap above the sacrificial gate electrode. In this illustrative example, the method also includes forming at least one sidewall spacer adjacent at least the sacrificial gate electrode, removing at least the sacrificial gate cap and the sacrificial gate electrode to form a replacement gate cavity between at least the first sidewall spacer, and forming a final replacement gate structure in the replacement gate cavity.

BRIEF DESCRIPTION OF THE DRAWINGS

The disclosure may be understood by reference to the following description taken in conjunction with the accompanying drawings, in which like reference numerals identify like elements, and in which.

Figure 1:
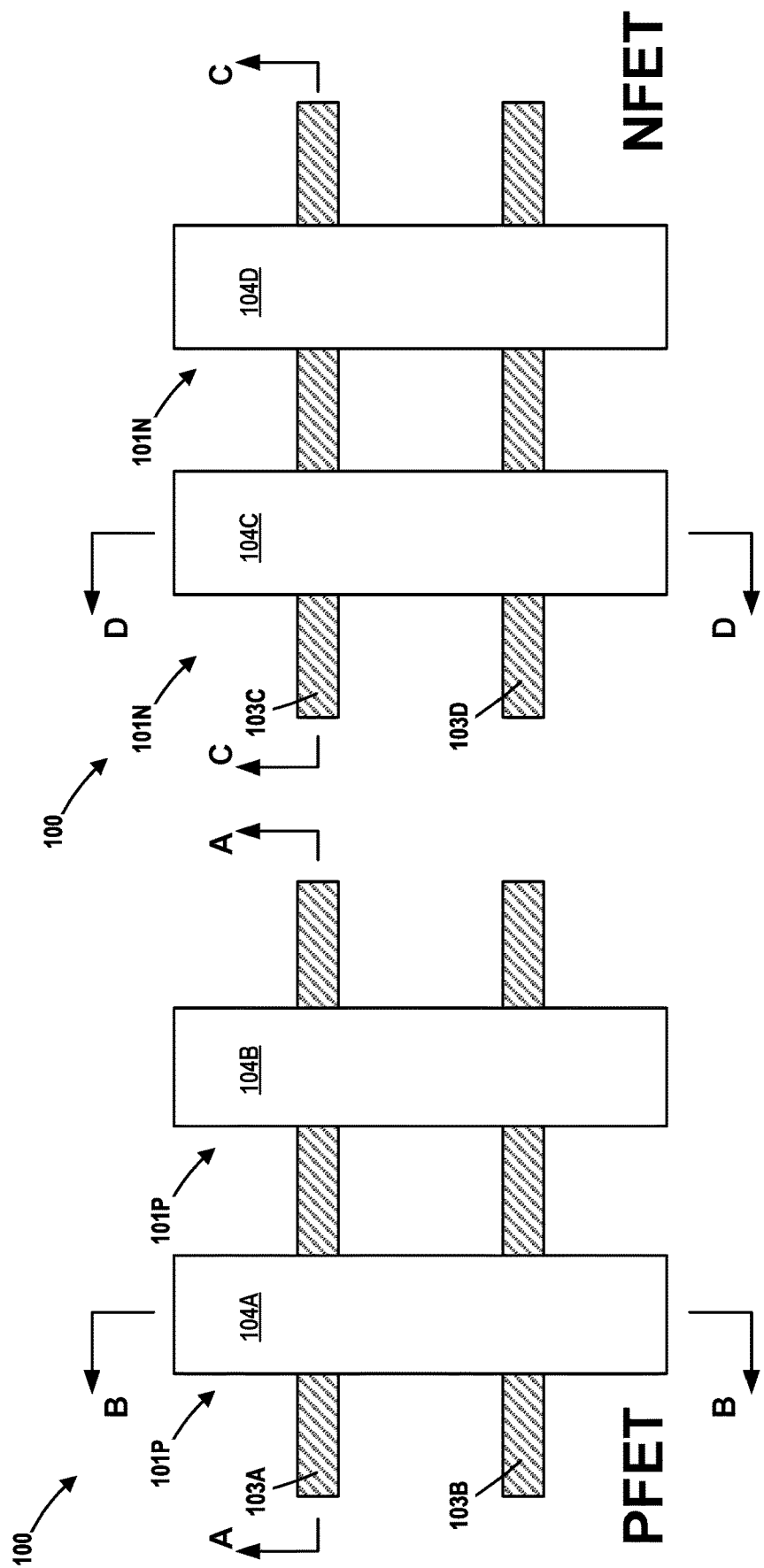
FIGS. 1-58 depict various novel methods of forming a replacement gate structure for a transistor device and various novel embodiments of an IC product comprising such transistor devices. The drawings are not to scale.
Figure 3:
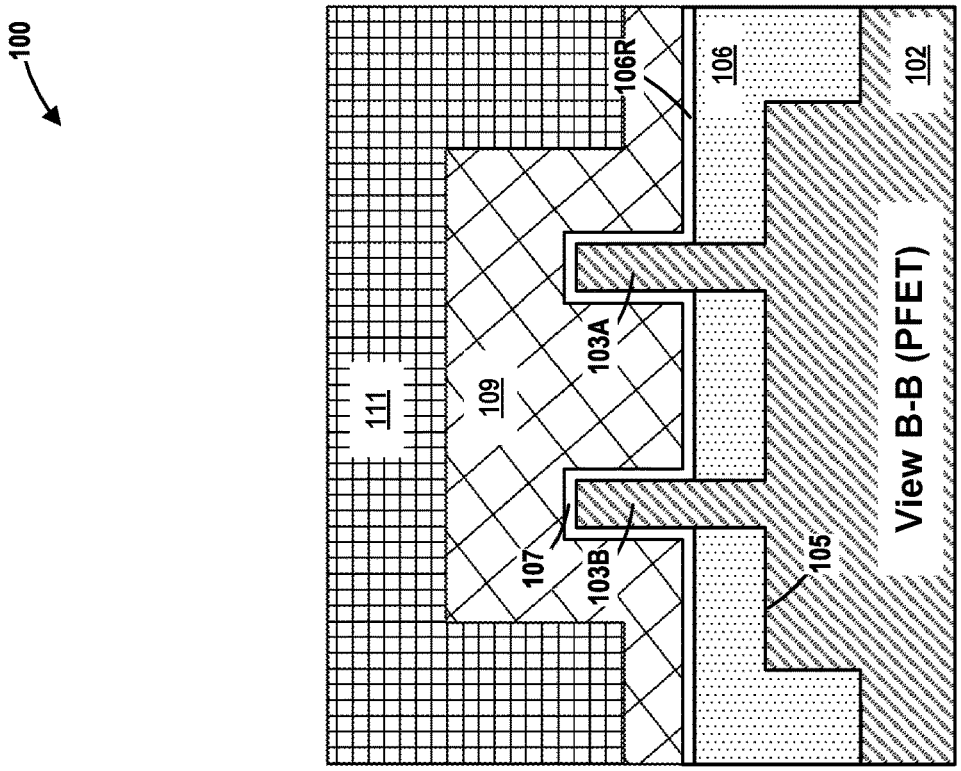
Figure 2:
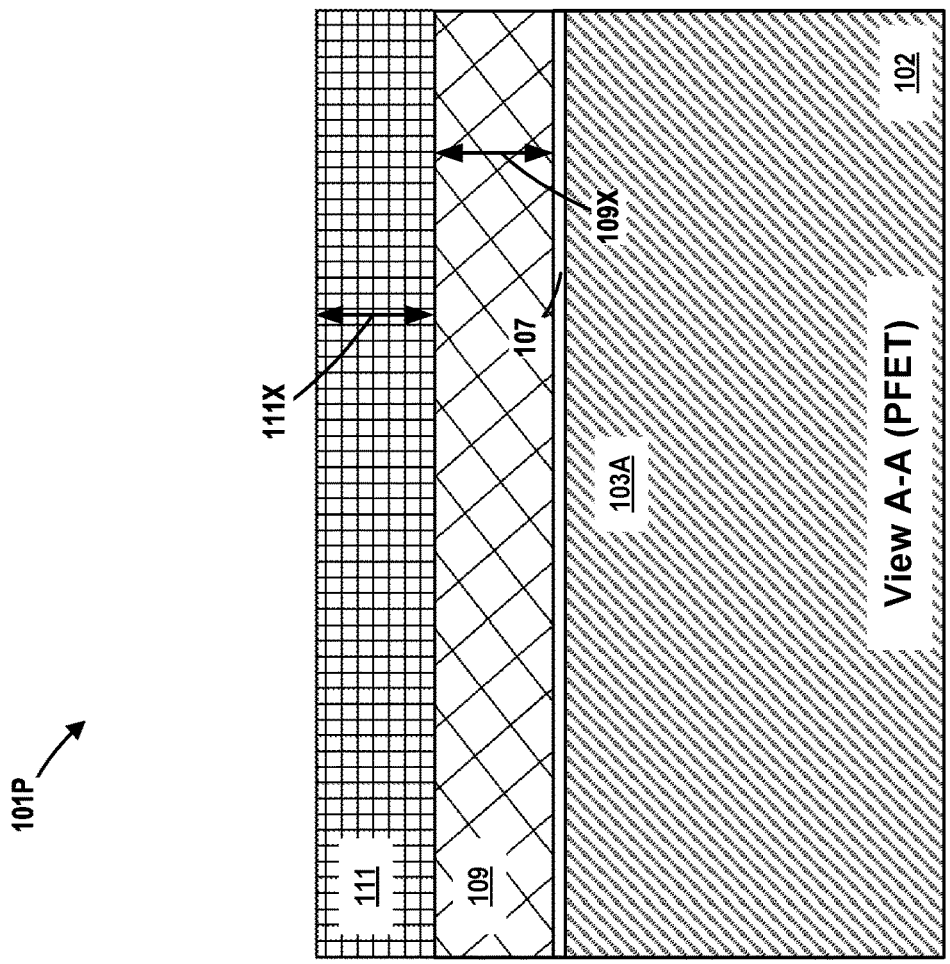
Figure 5:
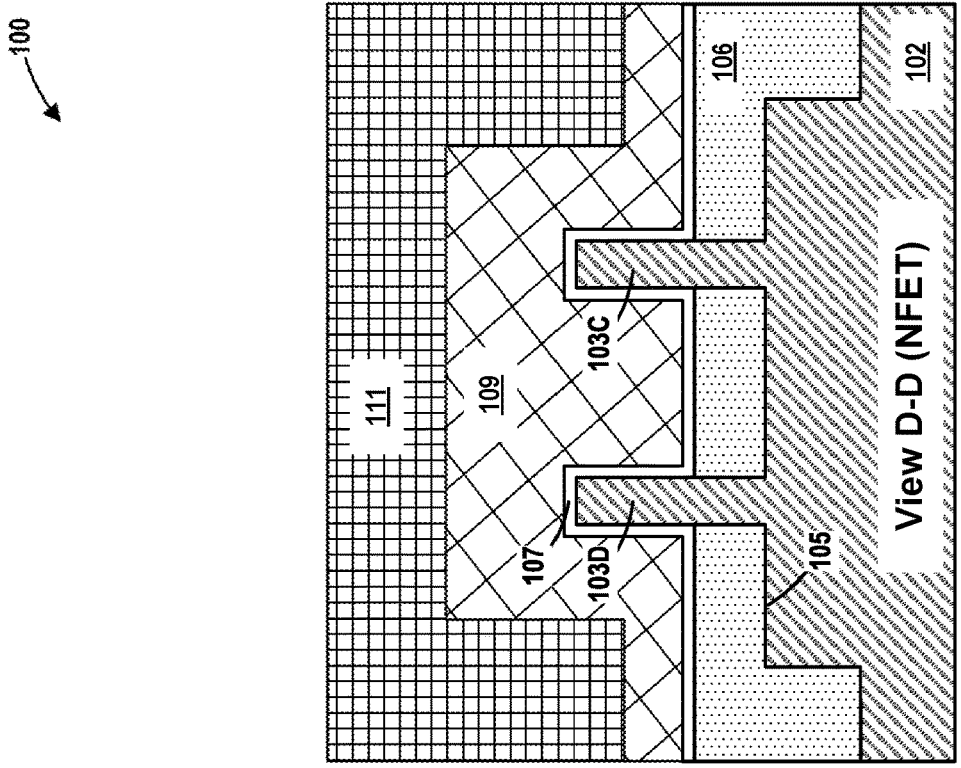
Figure 4:
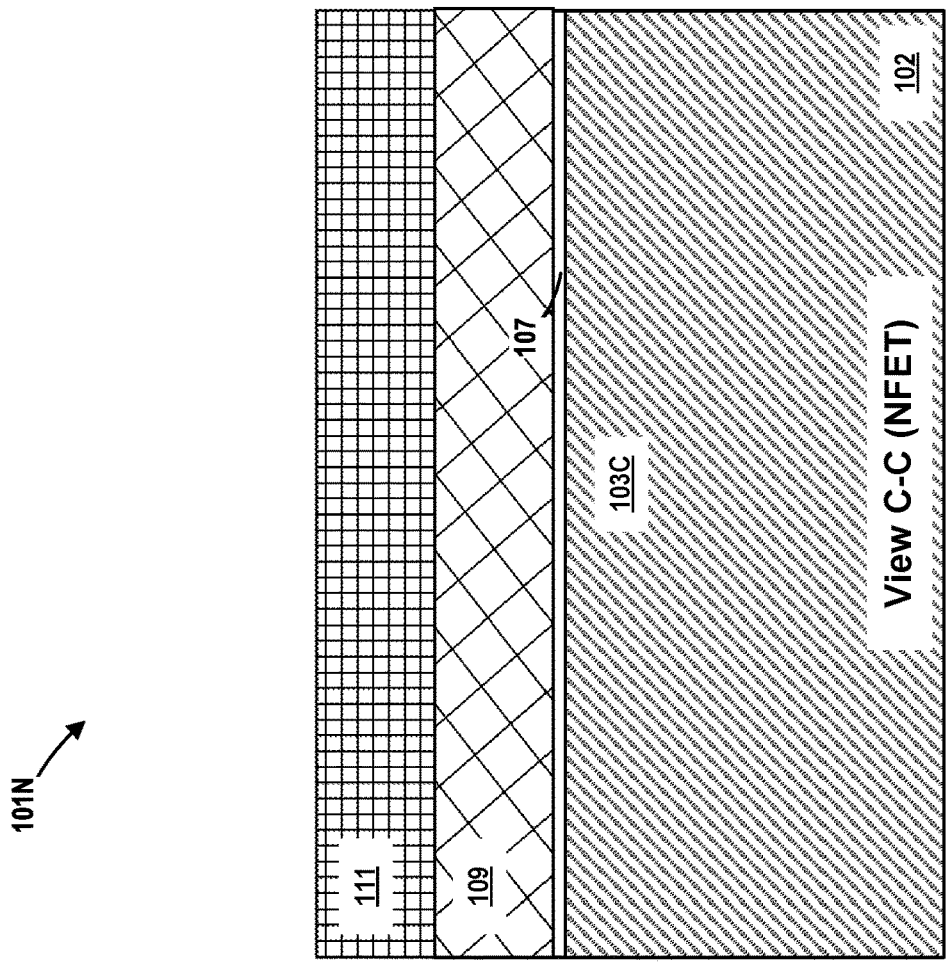
Figure 11:
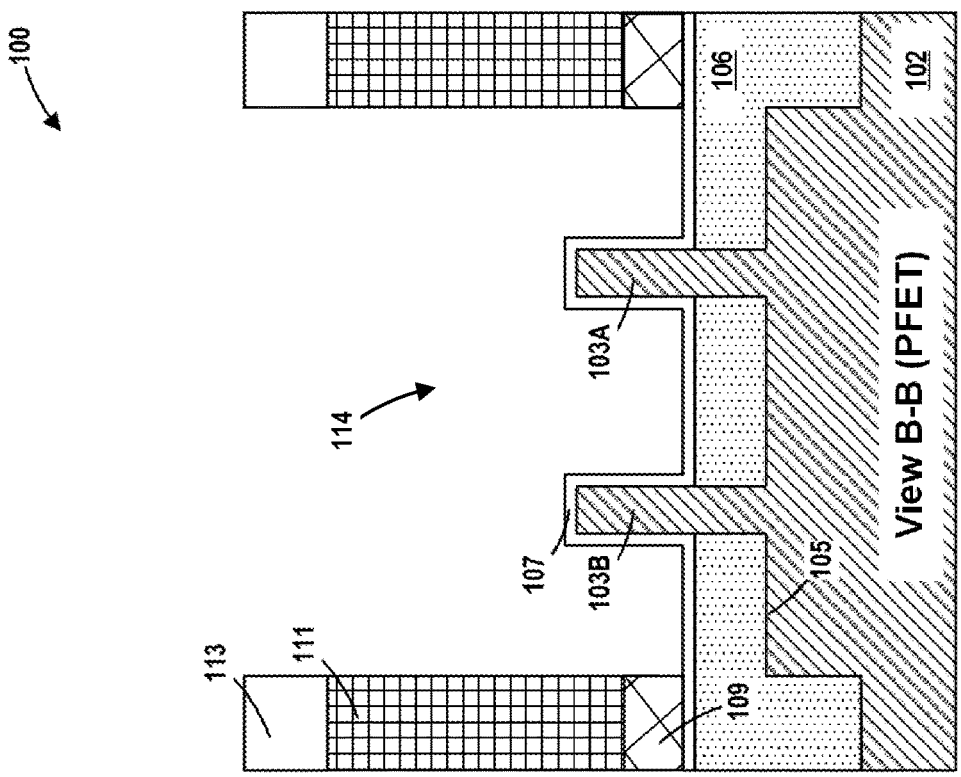
Figure 10:
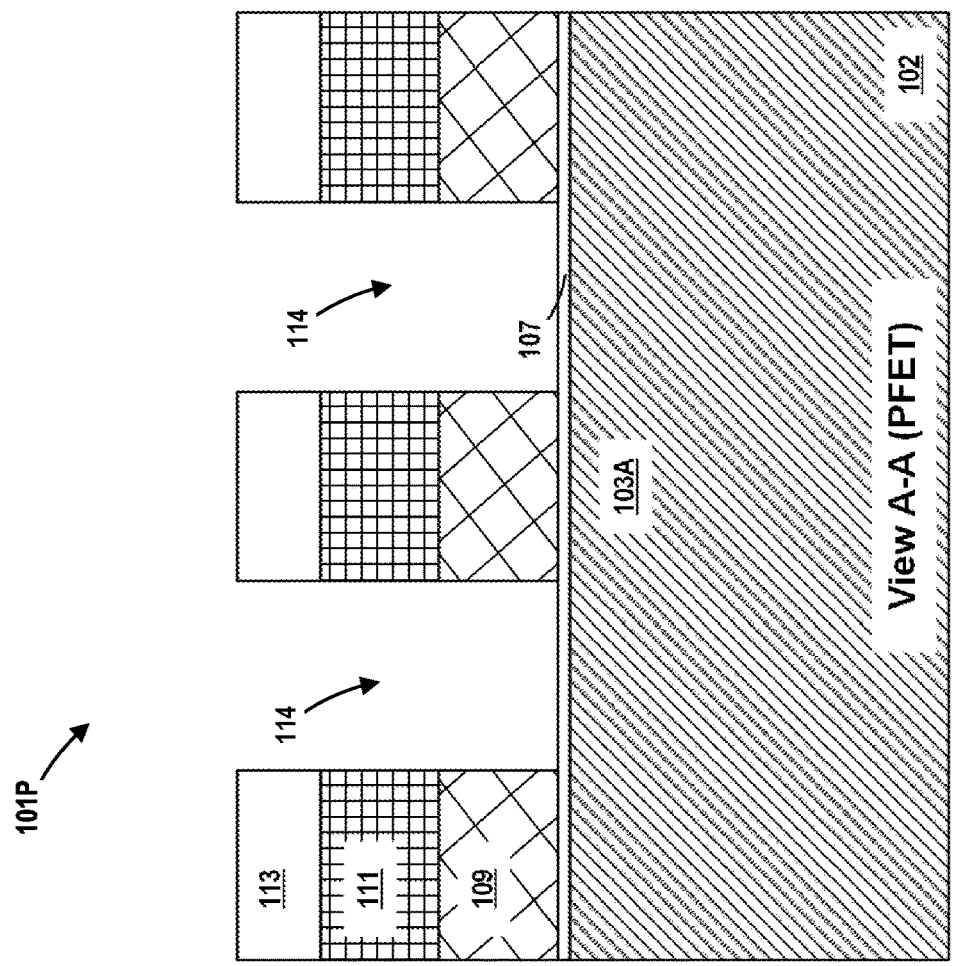
Figure 15:
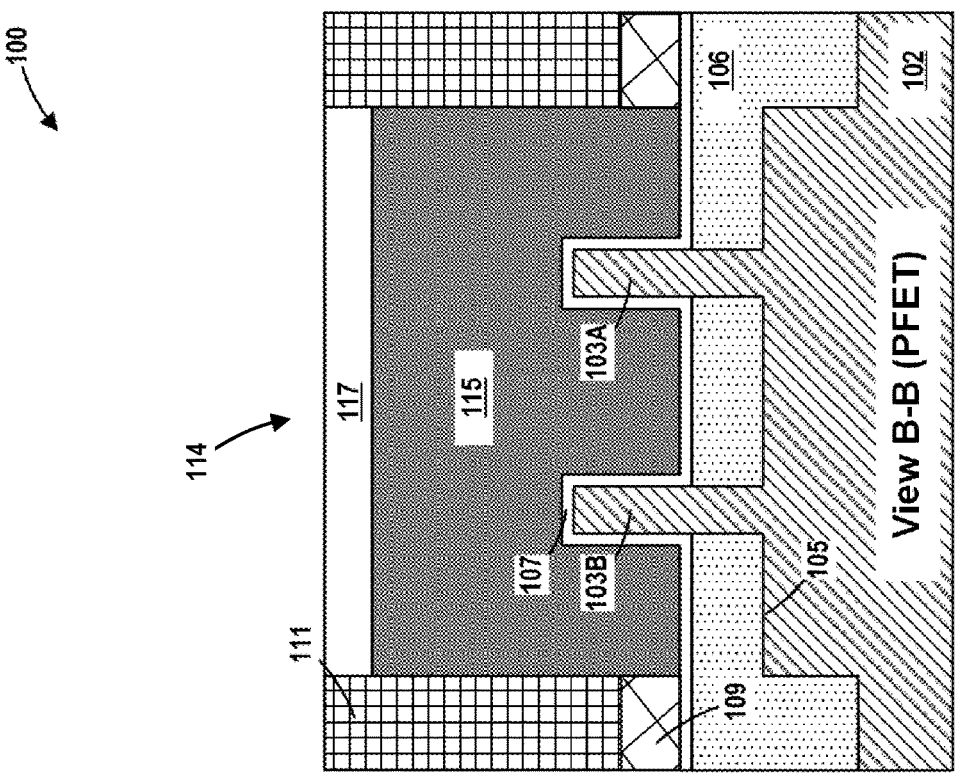
Figure 14:
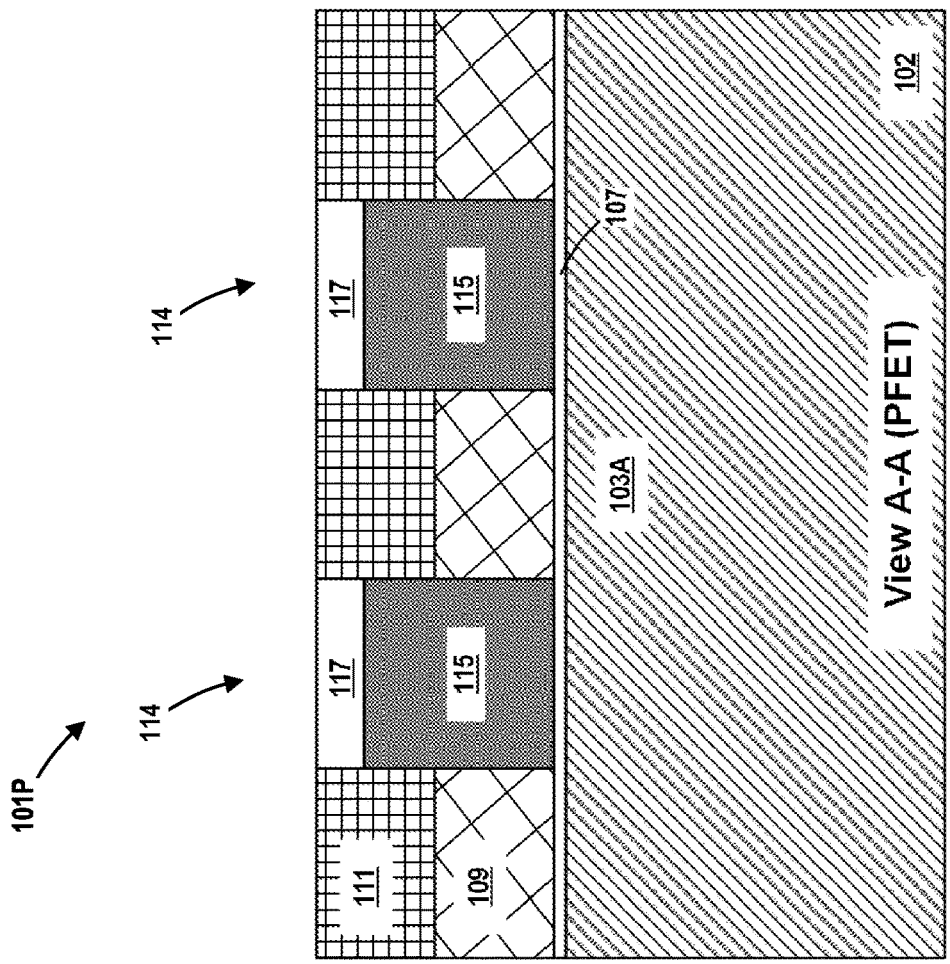
Figure 19:
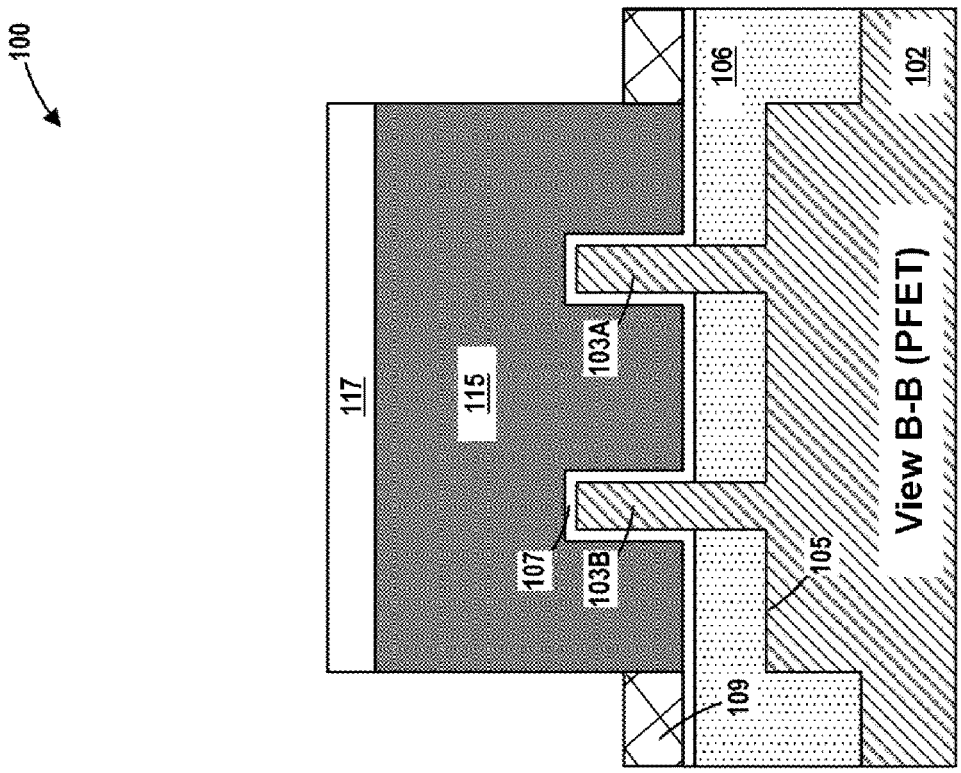
Figure 18:
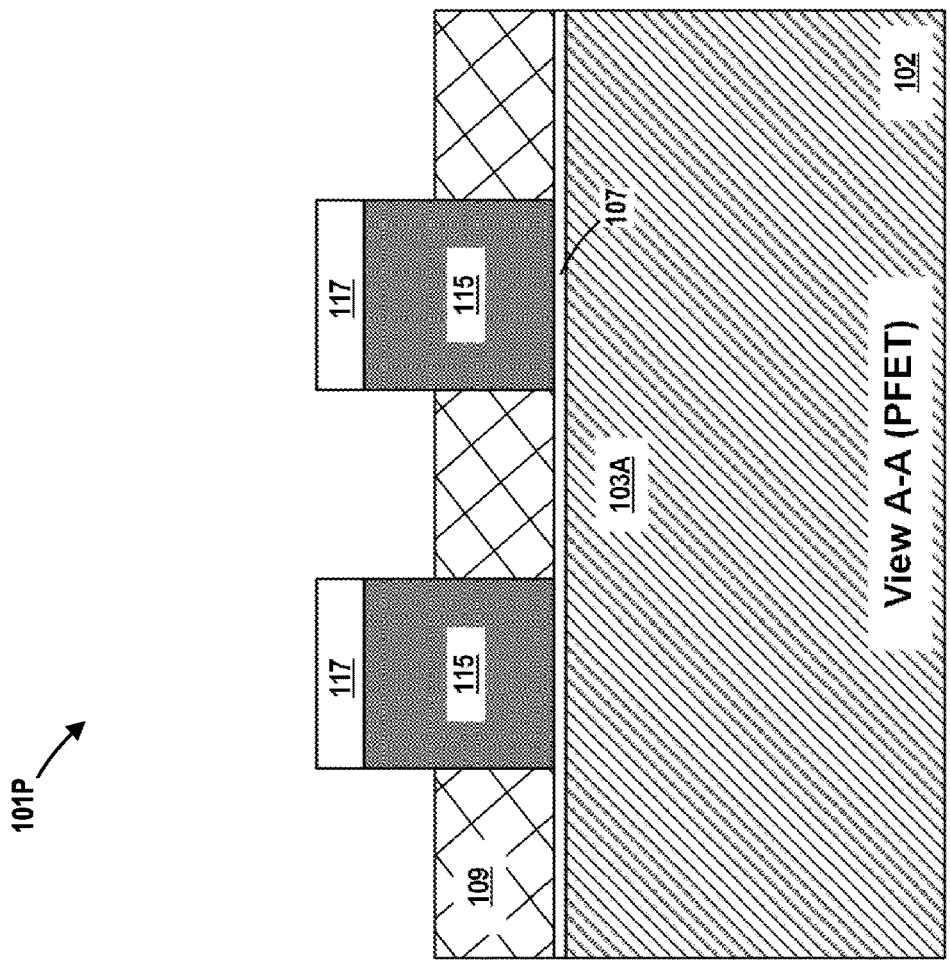
Figure 21:
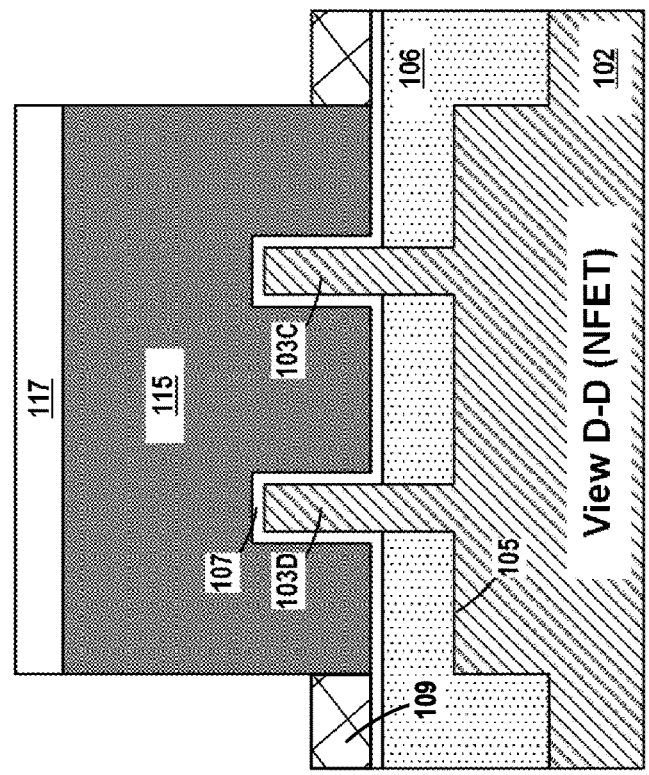
Figure 20:
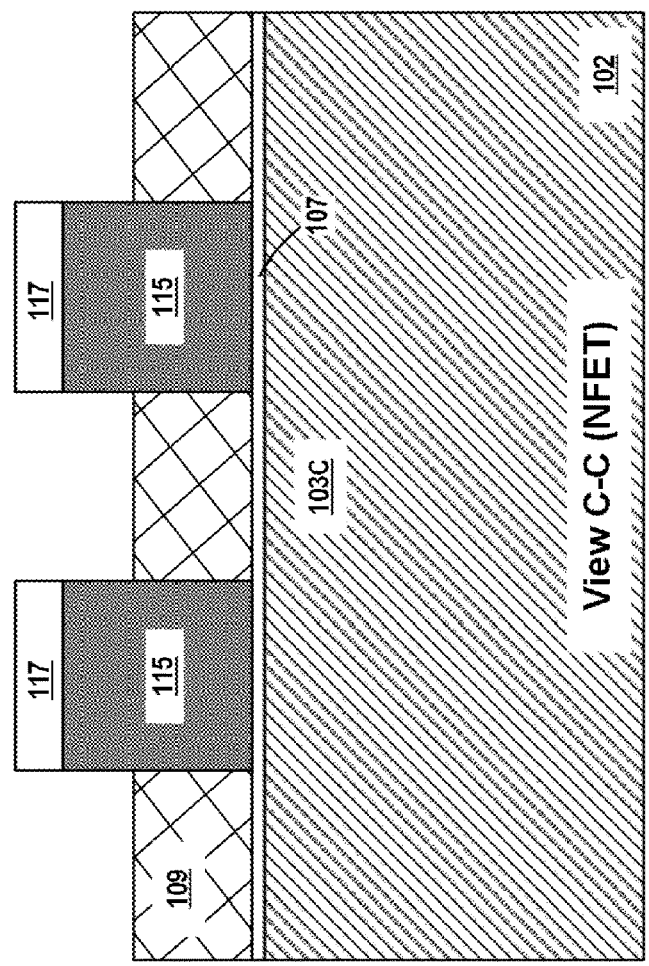
Figure 23:
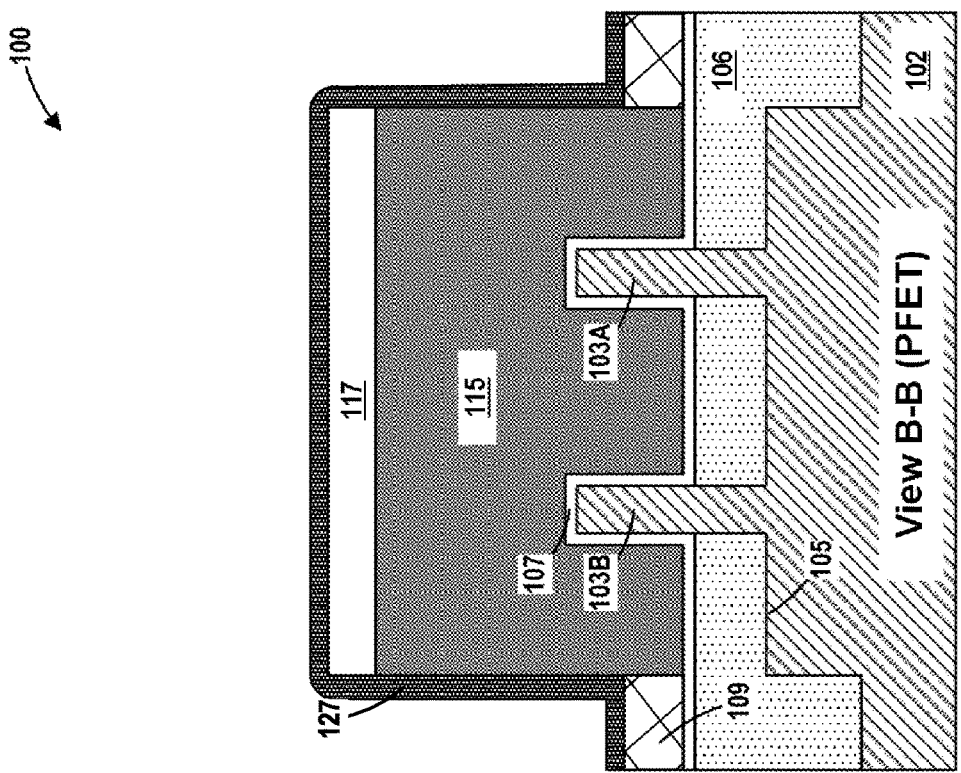
Figure 22:
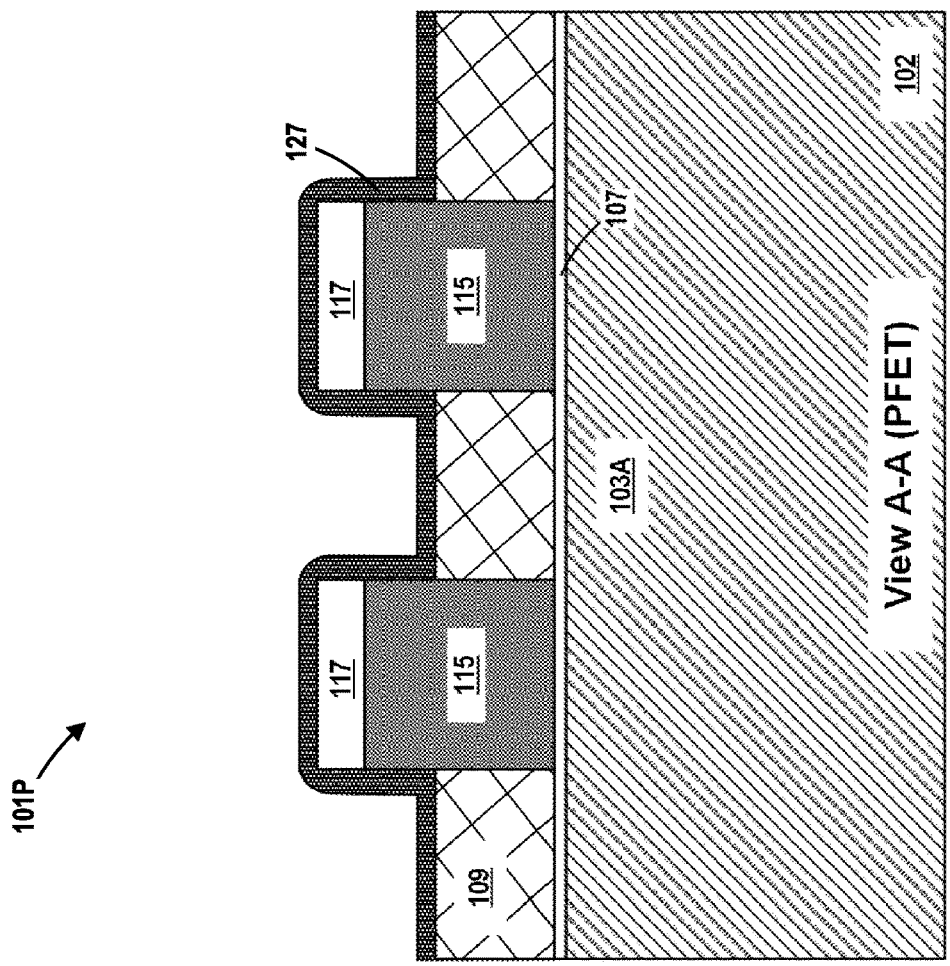

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the methods disclosed herein may be employed in manufacturing a variety of different products, including, but not limited to, logic products, memory devices, etc.

As will be appreciated by those skilled in the art after a complete reading of the present application, various doped regions, e.g., source/drain regions, halo implant regions, well regions and the like, are not depicted in the attached drawings. Of course, the inventions disclosed herein should not be considered to be limited to the illustrative examples depicted and described herein. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, etc. The thicknesses of these various layers of material may also vary depending upon the particular application. With reference to the attached figures, various illustrative embodiments of the methods and devices disclosed herein will now be described in more detail.

Figure 58:
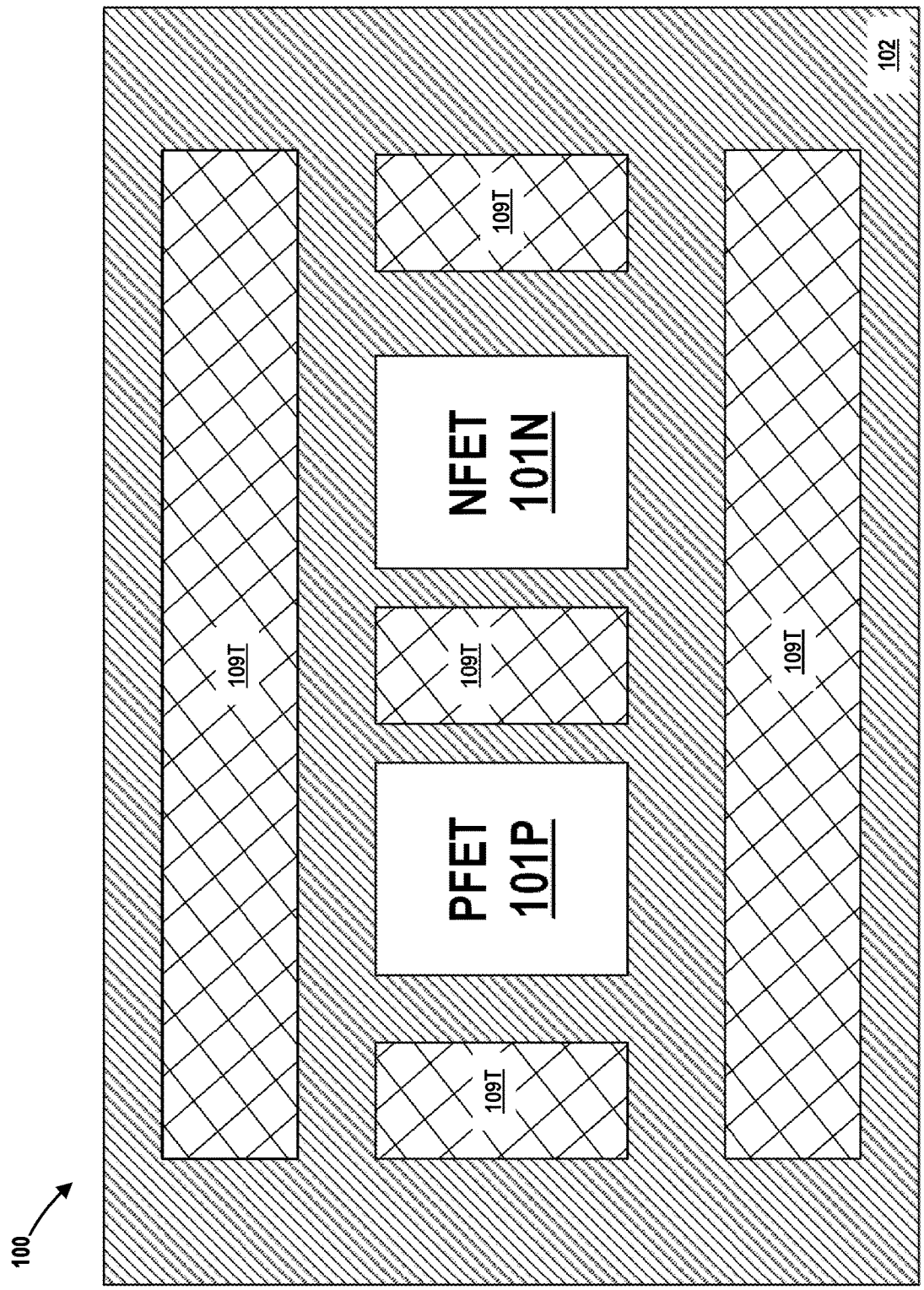

FIGS. 1-58 depict various novel methods of forming a replacement gate structure for a transistor device and various novel embodiments of an IC product 100 comprising such transistor devices. In the depicted example, the IC product 100 comprises a plurality of PFET transistors 101P and a plurality of NFET transistors 101N (collectively referenced using the numeral 101). The IC product 100 will be formed on and above a semiconductor substrate 102. The semiconductor substrate 102 may have a variety of configurations, such as a bulk silicon configuration. The substrate 102 may also have a semiconductor-on-insulator (SOI) configuration that includes a base semiconductor layer, a buried insulation layer and an active semiconductor layer positioned above the buried insulation layer, wherein transistor devices (not shown) that are formed on the substrate are formed in and above the active semiconductor layer. The substrate 102 may be made of silicon or it may be made of materials other than silicon. Thus, the terms "substrate" or "semiconductor substrate" should be understood to cover all semiconducting materials and all forms of such materials.

As will be appreciated by those skilled in the art after a complete reading of the present application, the transistor devices 101 disclosed herein may be either NFET devices or PFET devices. Moreover, the transistor devices 101 disclosed herein may have any configuration, e.g., FinFET devices, planar devices, vertical devices, etc. The gate length of the transistor devices 101 need not all be the same, but that may be the case in some applications. For purposes of disclosure, the transistor devices 101 depicted herein are FinFET devices, the gate structure for the transistor devices will be formed using a replacement gate manufacturing technique and the transistors 101 will be depicted as all having substantially the same gate length. However, the presently disclosed subject matter should not be considered to be limited to the illustrative examples depicted herein.

FIG. 1 is a simplistic plan view of the transistor devices 101. As shown therein, each of the PFET transistors 101P comprises first and second fins 103A, 103B and a gate structure 104A, 104B. Each of the NFET transistors 101N comprises first and second fins 103C and 103D and a gate structure 104C, 104D. The fins will be collectively referenced using the numeral 103. In the illustrative case where the transistor devices 101 are FinFET devices, each of the transistor devices 101 may be formed with any desired number of fins 103, and each of the transistor devices 101 need not have the same number of fins 103, but that may be the case in some applications. The height and cross-sectional configuration of the fins 103 may also vary depending upon the particular application. In the examples depicted herein, the fins 103 will be depicted as have a simplistic rectangular cross-sectional configuration having a substantially uniform thickness throughout the height of the fins 103. In a real-world device, the fins 103 may have a tapered cross-sectional configuration, wherein the width of the upper surface of the fin 103 (i.e., the top critical dimension) in the gate width direction of the devices 101 is less than the width of the bottom of the fin 103 in the gate width direction. Additionally, the axial length of the fins 103 may also vary depending upon the particular application, e.g., the axial length of the fins 103 on the PFET transistors 101P may be different than the axial length of the fins 103 on the NFET transistors 101N, but that may not be the case in all applications. Thus, the size and configuration of the fins 103, and the manner in which they are made, should not be considered a limitation of the presently disclosed subject matter.

FIG. 1 also indicates where various cross-sectional views (views "A-A", "B-B", "C-C" and "D-D") of the transistor devices 101 depicted in the attached drawings are taken. More specifically, the cross-sectional view A-A is taken through the axial length of the fin 103A in the gate length (GL—current transport) direction of the PFET transistors 101P. The cross-sectional view B-B is taken through the gate structure 104A of one of the PFET transistors 101P in the gate width (GW) direction of the PFET transistors 101P, i.e., transverse to the long axis of the fin 103A. Similarly, the cross-sectional view C-C is taken through the axial length of the fin 103C in the gate length (GL—current transport) direction of one of the NFET transistors 101N. The cross-sectional view D-D is taken through the gate structure 104C of one of the NFET transistors 101N in the gate width (GW) direction of the NFET transistor 101N, i.e., transverse to the long axis of the fin 103C. The plan view in the drawings does not reflect the processing shown in the cross-sectional views of the transistor devices 101.

FIGS. 2-5 depict the IC product 100 after several process operations were performed. First, the fins 103 were formed by performing known masking and etching processes to form fin-formation trenches 105 in the substrate 102. Then, a layer of insulating material 106 was formed so as to over-fill the trenches 105 between the fins 103. The layer of insulating material 106 may be comprised of, for example, silicon dioxide, a HARP oxide, HDP oxide, flowable oxide, SiOC, SiOCN, etc. Next, one or more planarization processes (e.g., a CMP and/or etch-back process) were performed to planarize the upper surface of the layer of insulating material 106. At that point, a timed, recess etching process was performed to remove a portion of the vertical thickness of the layer of insulating material 106 such that the layer of insulating material 106 has a substantially planar recessed upper surface 106R that is positioned at a desired height level within the trenches 105. The amount of recessing of the layer of insulating material 106 may vary depending upon the particular application. This recess etching process exposes the desired final fin height of the fins 103.

With continued reference to FIGS. 2-5, a sacrificial gate insulation layer 107 was formed for the transistor devices 101. The sacrificial gate insulation layer 107 may be comprised of a variety of different materials, e.g., silicon dioxide, it may be formed to any desired thickness, e.g., 1-10 nm, and it may be formed by performing a conformal deposition process. Next, a layer of polish-stop material 109 was formed above the sacrificial gate insulation layer 107 so as to over-fill the trenches 105 between the fins 103. The layer of polish-stop material 109 may be comprised of, for example, silicon carbon nitride (SiCN), SiBN, SiCNB, etc., and it may be formed by performing a conformal deposition process. The layer of polish-stop material 109 has a vertical thickness 109X at a location above the upper surface of the substrate 102 (e.g., above the upper surface of the fin 103 in the case of a FinFET device or above a planar upper surface of a substrate for a planar transistor device), the magnitude of which may vary depending upon the particular application, e.g., 5-100 nm. Thereafter, a layer of sacrificial material 111 was formed above the layer of polish-stop material 109. The layer of sacrificial material 111 may be comprised of a variety of different materials, e.g., amorphous carbon, SiOH, SiON, etc., and it may be formed by performing a blanket deposition process. In some cases, the upper surface of the layer of sacrificial material 111 may be planarized after it is initially deposited. The layer of sacrificial material 111 has a vertical thickness 111X at a location above the upper surface of the substrate 102, the magnitude of which may vary depending upon the particular application, e.g., 5-1000 nm.

FIGS. 6-9 depict the IC product 100 after a patterned etch mask 113, e.g., a patterned layer of photoresist/BARC, was formed on the product 100 by performing traditional manufacturing techniques.

FIGS. 10-13 depict the IC product 100 after one or more etching processes were performed to remove exposed portions of the layer of sacrificial material 111 and the layer of polish-stop material 109. This process operation stops on the sacrificial gate insulation layer 107 and results in the formation of a plurality of sacrificial gate cavities 114.

FIGS. 14-17 depict the IC product 100 after several process operations were performed. First, the patterned etch mask 113 was removed. Thereafter, sacrificial (or "dummy") gate electrode structures 115, with a sacrificial gate cap 117 formed thereabove, were formed in the sacrificial gate cavity 114 for each of the transistors 101. Collectively, the sacrificial gate electrode 115 and the sacrificial gate insulation layer 107 may be referred to as the sacrificial gate structure for the transistor devices 101. In one illustrative embodiment, the sacrificial gate electrode 115 may comprise polysilicon or amorphous silicon and the sacrificial gate cap 117 may comprise silicon nitride. In one illustrative process flow, the sacrificial gate electrodes 115 may be formed by depositing the material of the sacrificial gate electrodes 115 across the product 100 so as to over-fill the sacrificial gate cavities 114. Then, one or more CMP process and/or etch-back process operations were performed to remove all of the material of the sacrificial gate electrodes 115 positioned outside of the sacrificial gate cavities 114 and above the upper surface of the layer of sacrificial material 111. At that point, a recess etching process was performed to remove some of the vertical thickness of the sacrificial gate electrode 115 within the sacrificial gate cavities 114 so as to make room for the sacrificial gate caps 117 that will be formed above the recessed materials of the sacrificial gate electrodes 115 within the sacrificial gate cavities 114. Note that the process of forming at least the sacrificial gate electrode 115 and the sacrificial gate cap 117 in a previously formed sacrificial gate cavity 114 is fundamentally different from prior art techniques wherein the sacrificial gate electrodes and the sacrificial gate caps were formed by blanket depositing the materials for the sacrificial gate electrodes and the sacrificial gate caps above the substrate and thereafter patterning those materials to form elongated line-type features that comprise the patterned sacrificial gate electrode and the sacrificial gate cap. At that point, one or more sidewall spacers were formed adjacent the line-type structures and one or more layers of insulating material were formed in remaining spaces between the spacers positioned adjacent the sacrificial gate structures.

FIGS. 18-21 depict the IC product 100 after one or more etching processes were performed to remove the layer of sacrificial material 111 selectively relative to the surrounding materials. This process operation exposes the upper surface of the layer of polish-stop material 109 as well the sidewalls of an upper portion of the sacrificial gate electrodes 115.

Figure 25:
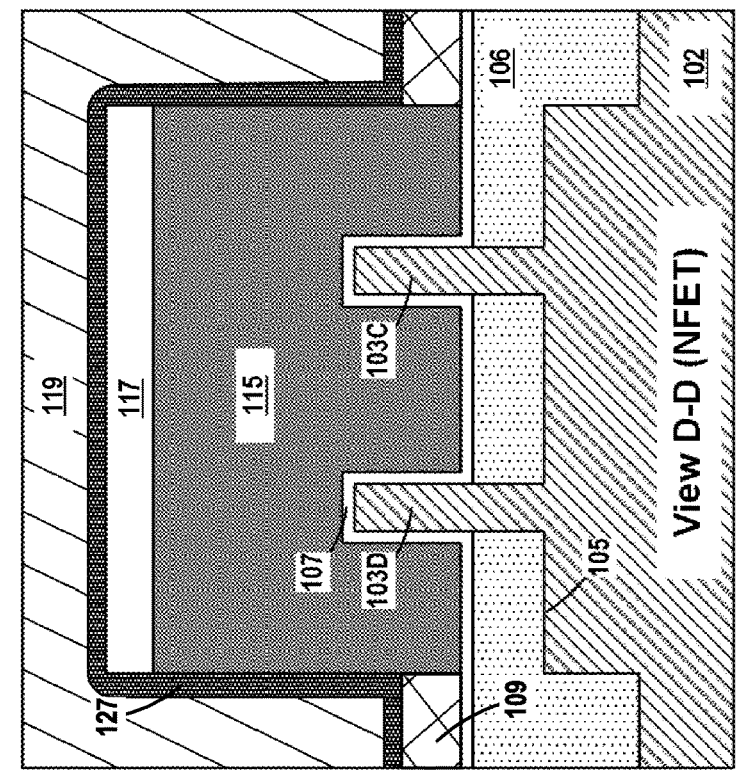
Figure 24:
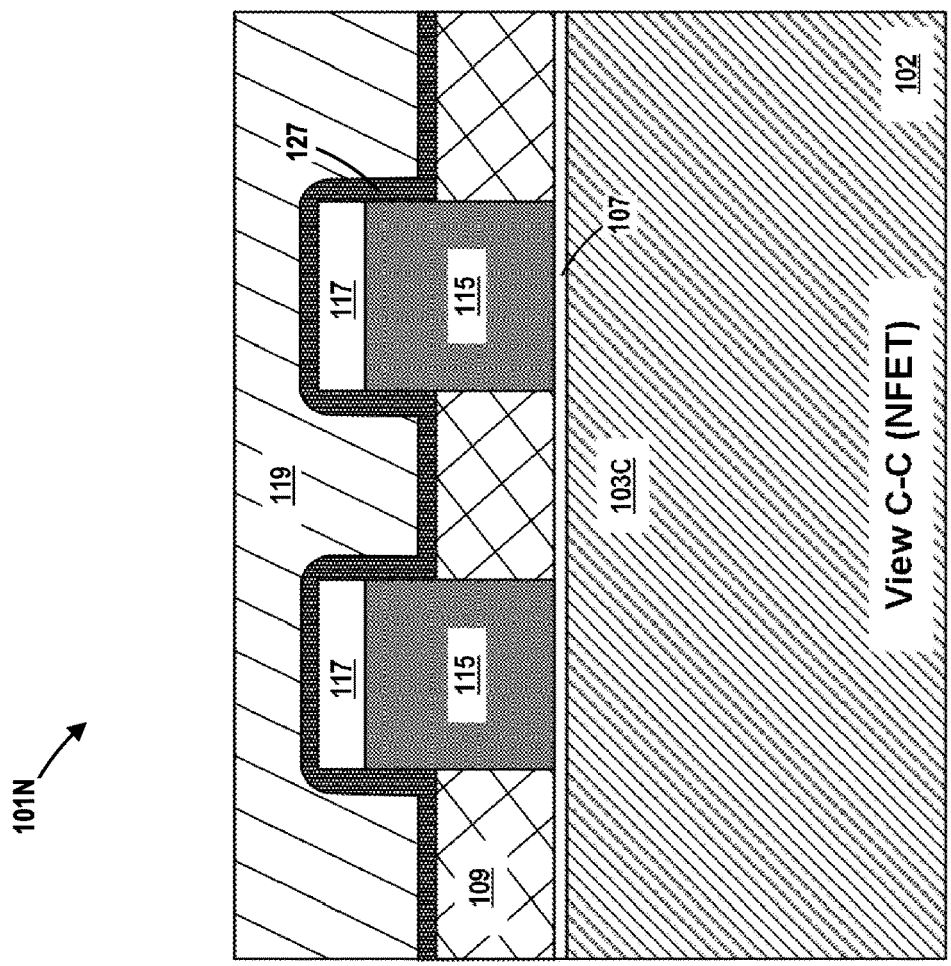
Figure 29:
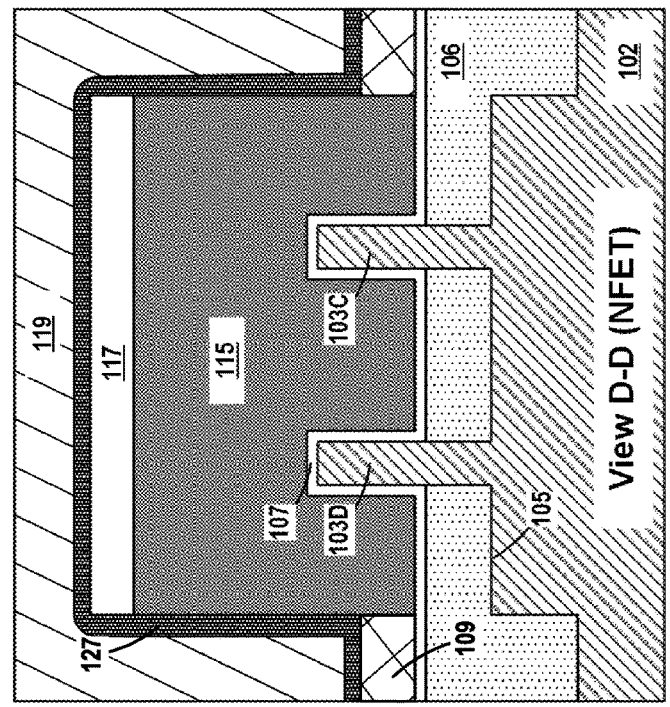
Figure 28:
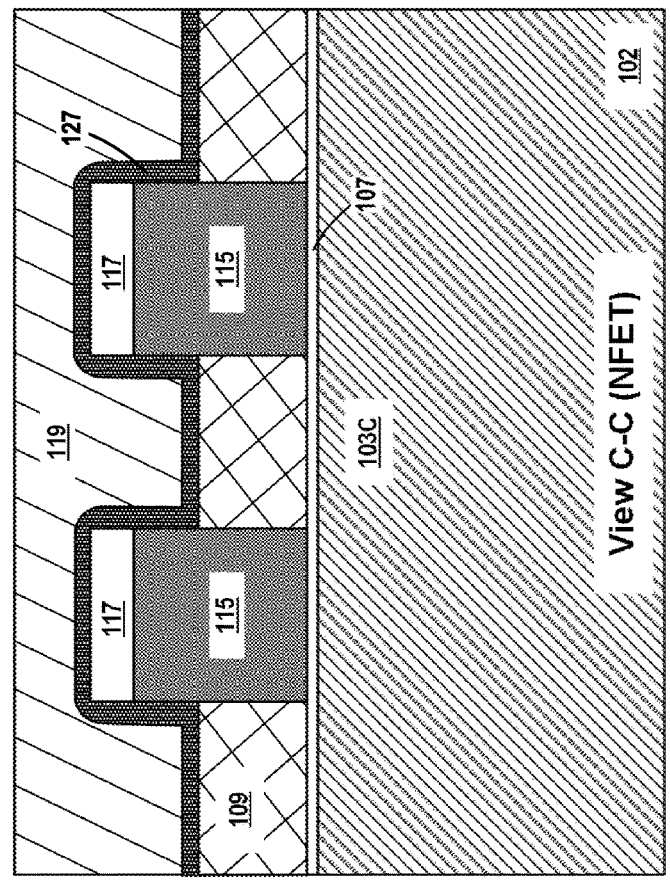
Figure 31:
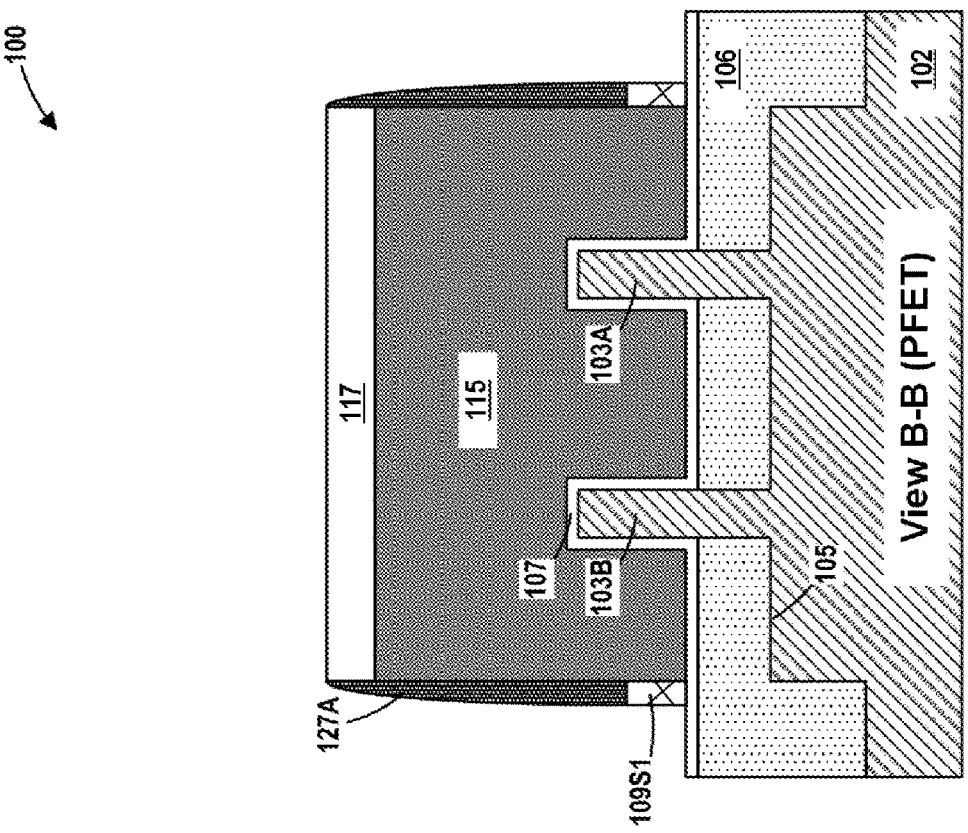
Figure 30:
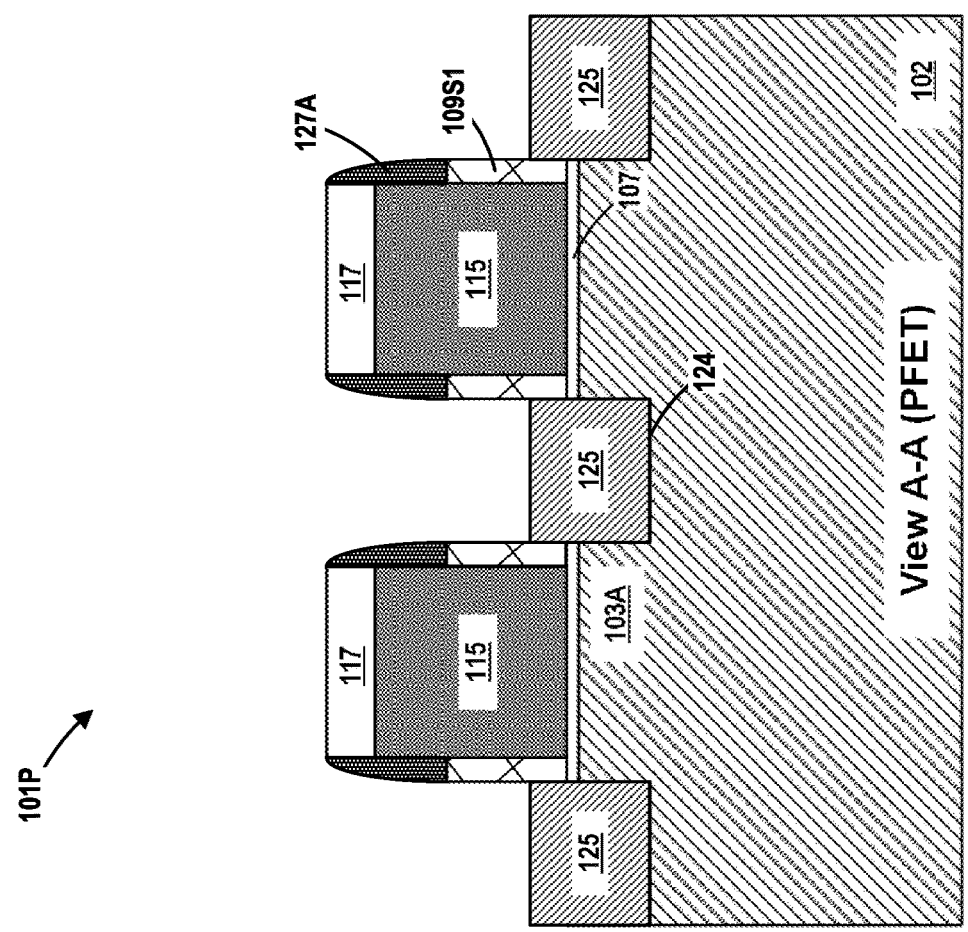
Figure 33:
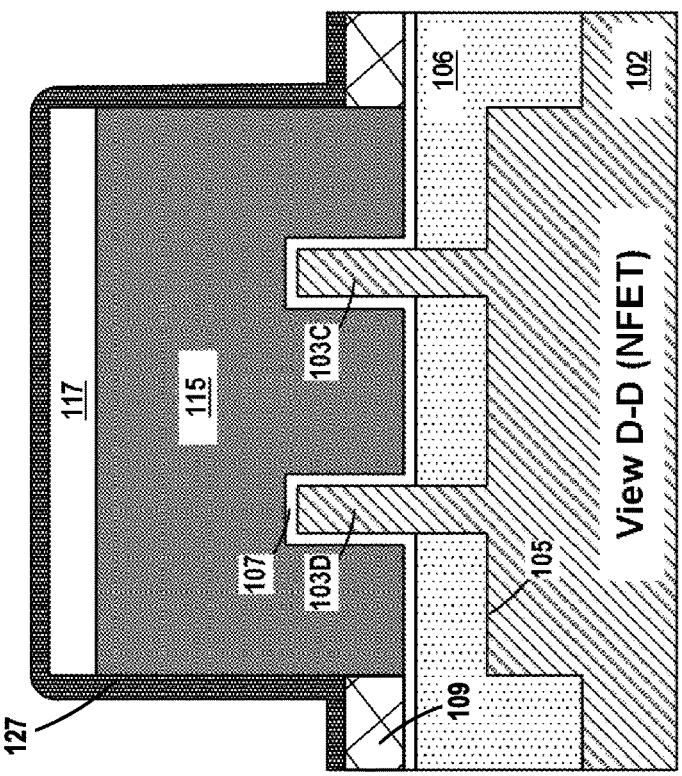
Figure 32:
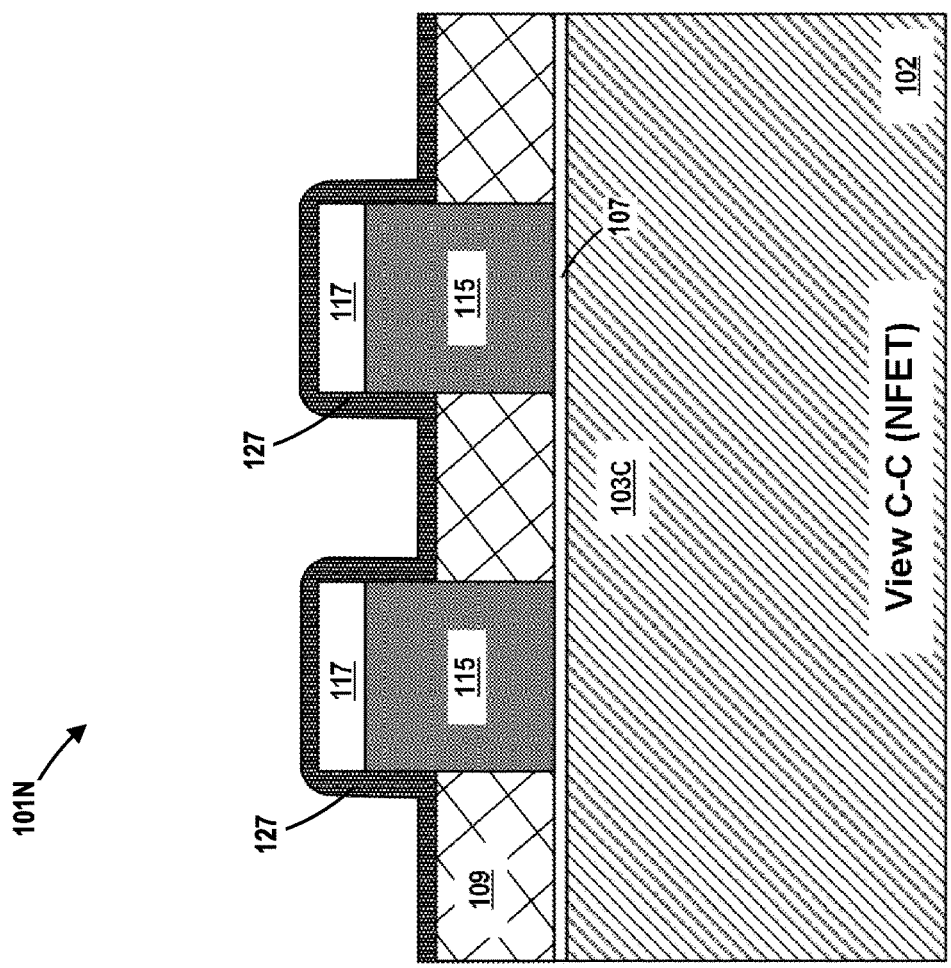
Figure 35:
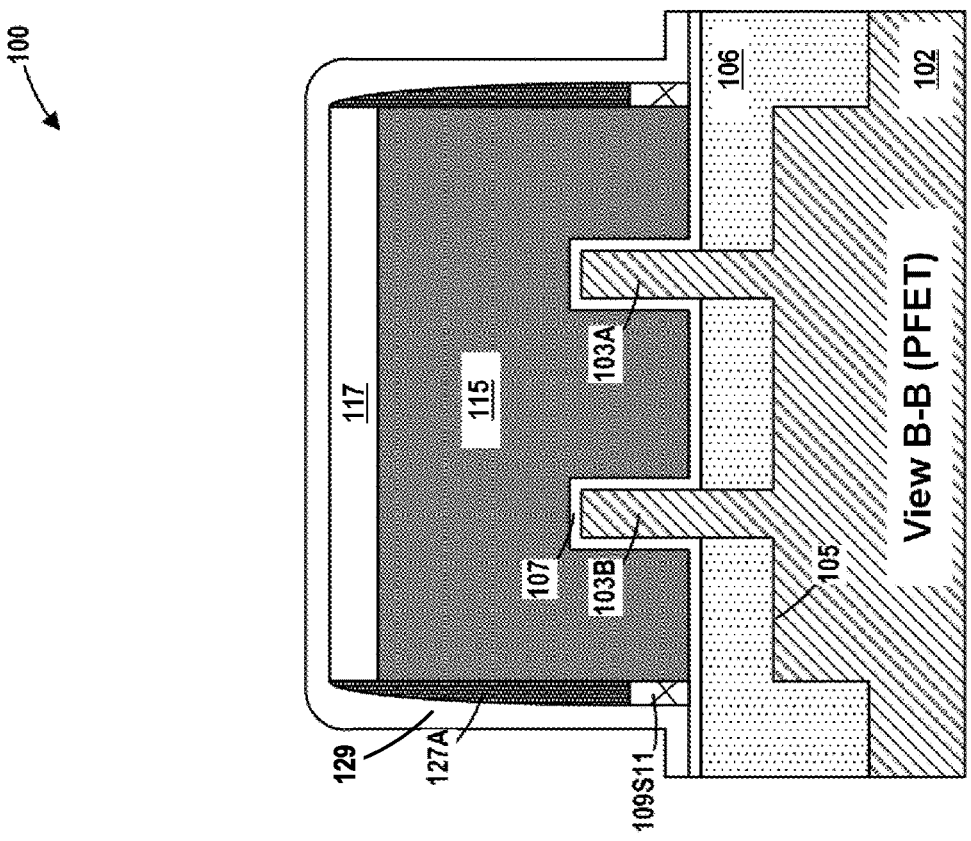
Figure 34:
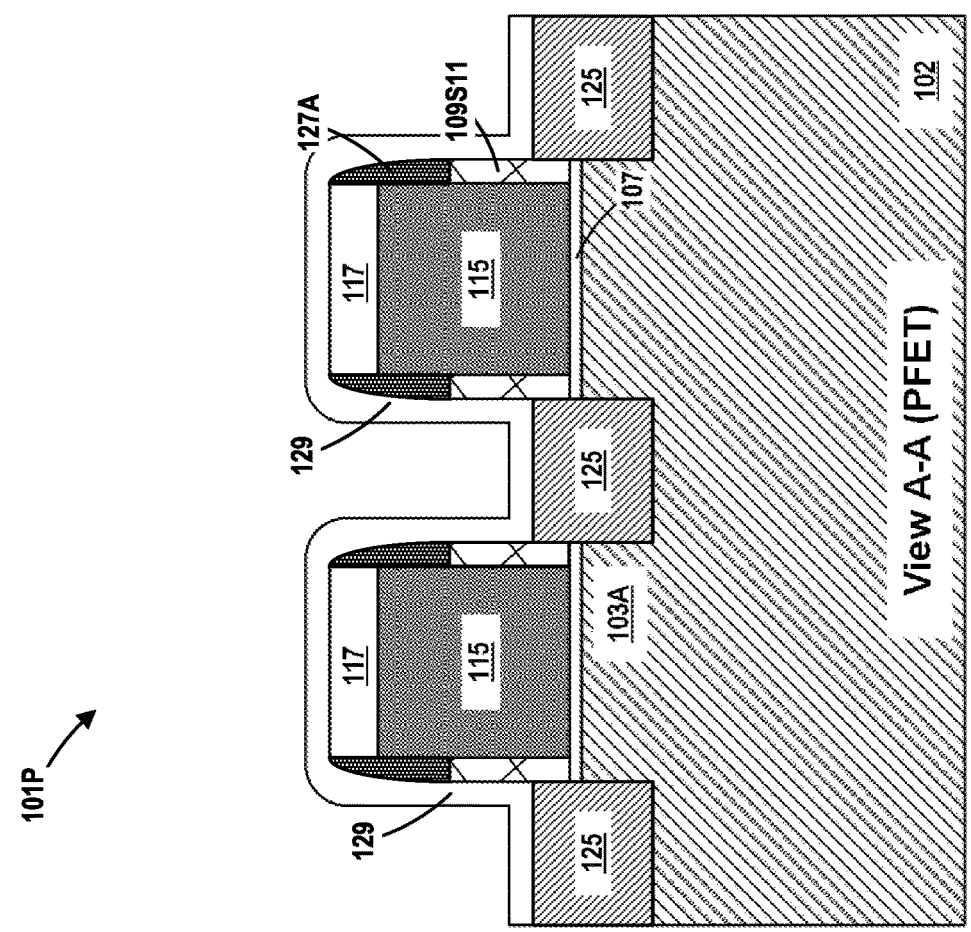
Figure 37:
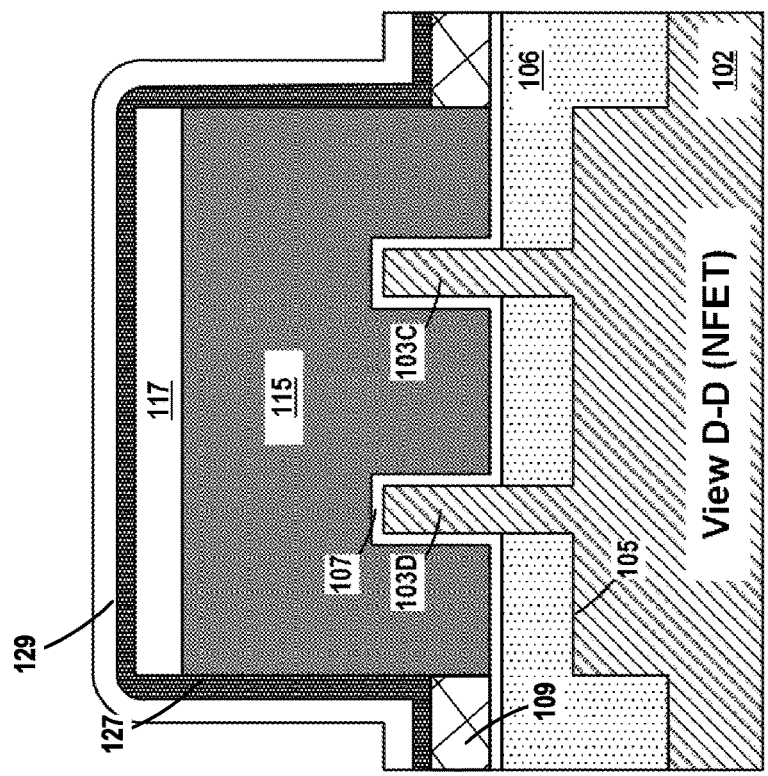
Figure 36:
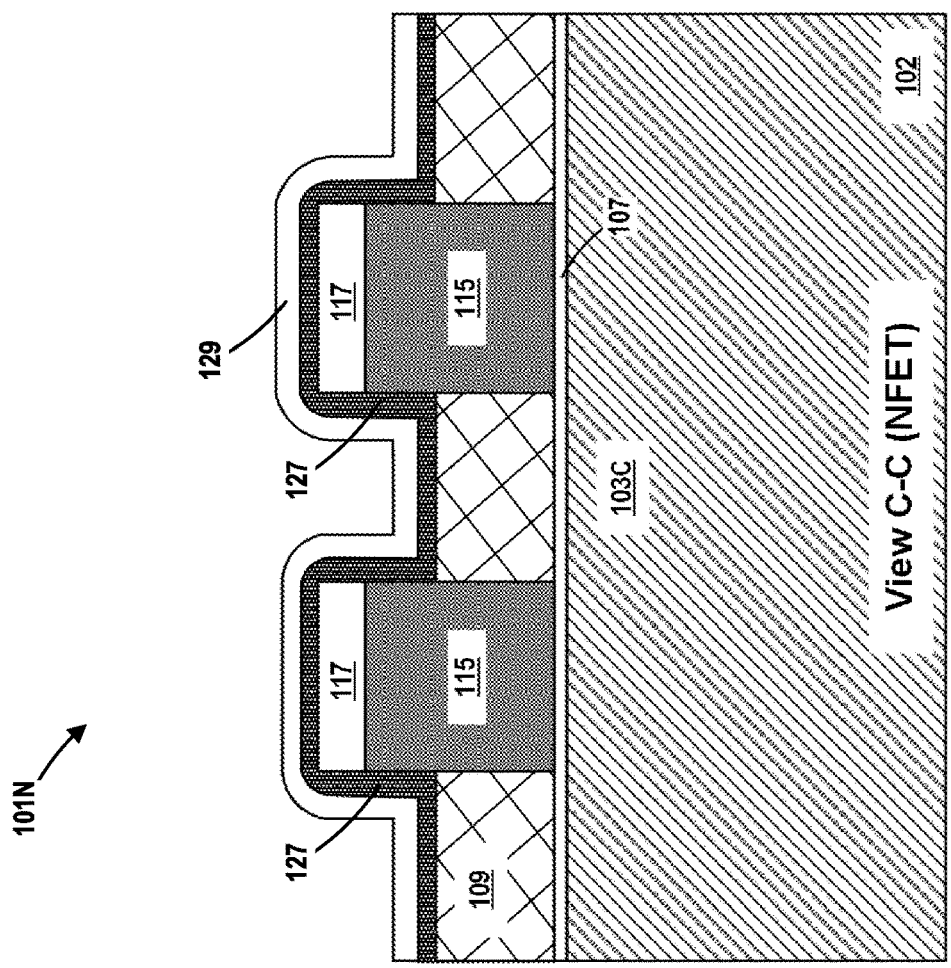

FIGS. 22-25 depict the IC product 100 after several process operations were performed. First, a liner layer 127 was formed on both of the devices 101. The liner layer 127 may be comprised of a variety of different materials (e.g., a low-k material (k value of 3.3 or less), etc.), it may be formed to any desired thickness (e.g., 2-50 nm), and it may be formed by performing a conformal deposition process. Next, as shown in FIGS. 24-25, a patterned mask layer 119, e.g., a patterned layer of photoresist/BARC, was formed on the product 100 by performing traditional manufacturing techniques. The patterned mask layer 119 covers the NFET transistors 101N while leaving the PFET transistors 101P exposed for further processing.

FIGS. 26-29 depict the IC product 100 after several process operations were performed. First, an illustrative sidewall spacer structure 127A (e.g., a low-k material (k value of 3.3 or less), etc.) was formed adjacent the exposed sidewalls of the sacrificial gate electrodes 115 of the PFET transistors 101P and above the layer of polish-stop material 109. The spacer structure 127A may be formed by performing an anisotropic etching process on the liner layer 127. In the examples depicted herein, the spacer structure 127A is depicted as a single sidewall spacer. In practice, the spacer structure 127A may be comprised of a plurality of sidewall spacers that may or may not be comprised of different materials. The lateral width of the spacer structure 127A (in the gate length direction of the devices 101) at the base of the spacer structure 127A may vary depending upon the particular application, e.g., 2-50 nm. Next, an anisotropic etching process was performed to remove exposed portions of the layer of polish-stop material 109 wherein the spacer structure 127A acts as an etch mask. This process operation exposes the sacrificial gate insulation layer 107 results in the formation of a polish-stop sidewall spacer 109S1 positioned adjacent the sidewalls of a lower portion of the sacrificial gate electrodes 115 of the PFET transistors 101P. The lateral width of the spacer structure 127A (in the gate length direction of the devices 101) at the base of the spacer structure 127A substantially defines the lateral width of the polish-stop sidewall spacer 109S1 (in the gate length direction of the devices 101), which may impact downstream etch cavity and proximity and, as a result, may affect device performance. This process operation results in the formation of a composite spacer structure 123 that comprises the spacer structure 127A positioned above (or in some cases on and in physical contact with) the polish-stop sidewall spacer 109S1. Given the nature of the process performed to form the polish-stop sidewall spacer 109S1, at a location above the upper surface of the substrate 102 (e.g., above the upper surface of the fin 103 in the case of a FinFET device or above a planar upper surface of a substrate for a planar transistor device), the polish-stop sidewall spacer 109S1, when viewed in a cross-section taken through the polish-stop sidewall spacer 109S1 in a direction corresponding to the gate length direction of the devices 101, may have a substantially rectangular configuration. That is, the polish-stop sidewall spacer 109S1, at a location above the upper surface of the substrate 102, may have a substantially uniform width 109W1 throughout substantially an entire vertical height 109H1 of the polish-stop sidewall spacer 109S1. In some applications, the width 109W1 may range from about 2-50 nm and the vertical height 109H1 may range from about 5-100 nm. The polish-stop sidewall spacer 109S1, at a location above the upper surface of the substrate 102, may also have a substantially planar upper surface 109U that is substantially parallel to the upper surface of the substrate 102.

With reference to FIG. 58, at the time the layer of polish-stop material 109 was formed on the substrate 102 (see FIGS. 2-5), the layer of polish-stop material 109 may also be blanket deposited in areas of the substrate 102 where active transistor devices will not be formed (e.g., one or more "dummy" areas of the substrate 102). At some point in the process flow, such as, for example, when performing the etching process to form the polish-stop sidewall spacer 109S1, the layer of polish-stop material 109 may be patterned to define one or more regions of polish-stop material 109T at one or more locations on the substrate 102, as shown in FIG. 58. In the depicted example, the regions of polish-stop material 109T are depicted as being discrete islands of polish-stop islands of material. However, as will be appreciated by those skilled in the art after a complete reading of the present application, the regions of polish-stop material 109T may be of any size or configuration (when viewed from above), and the regions of polish-stop material 109T need not be formed as discrete islands of material. Moreover, some IC products 100 may not have any of the regions of polish-stop material 109T. If present, the one or more regions of polish-stop material 109T may be formed at any desired location on the substrate 102. For example, such regions of polish-stop material 109T may be formed in one or more die on the substrate 102, in the scribe lines, etc. If present, the regions of polish-stop material 109T may be formed in an organized pattern or array or they may be formed randomly across the substrate 102.

FIGS. 30-33 depict the IC product 100 after several process operations were performed. First, known manufacturing techniques were performed to form epi cavities 124 in the substrate 102 in the source/drain regions of the PFET transistors 101P. Thereafter, known manufacturing techniques were performed to form epi semiconductor material 125 in the epi cavities 124. The source/drain epi semiconductor material 125 for the PFET transistors 101P may be comprised of a variety of different materials, e.g., silicon (Si), silicon germanium (SiGe), etc.

FIGS. 34-37 depict the IC product 100 after a layer of spacer material 129 was formed on both of the devices 101. The layer of spacer material 129 may be comprised of a variety of different materials (e.g., a low-k material (k value of 3.3 or less), etc.), it may be formed to any desired thickness (e.g., 2-50 nm), and it may be formed by performing a conformal deposition process.

Figure 39:
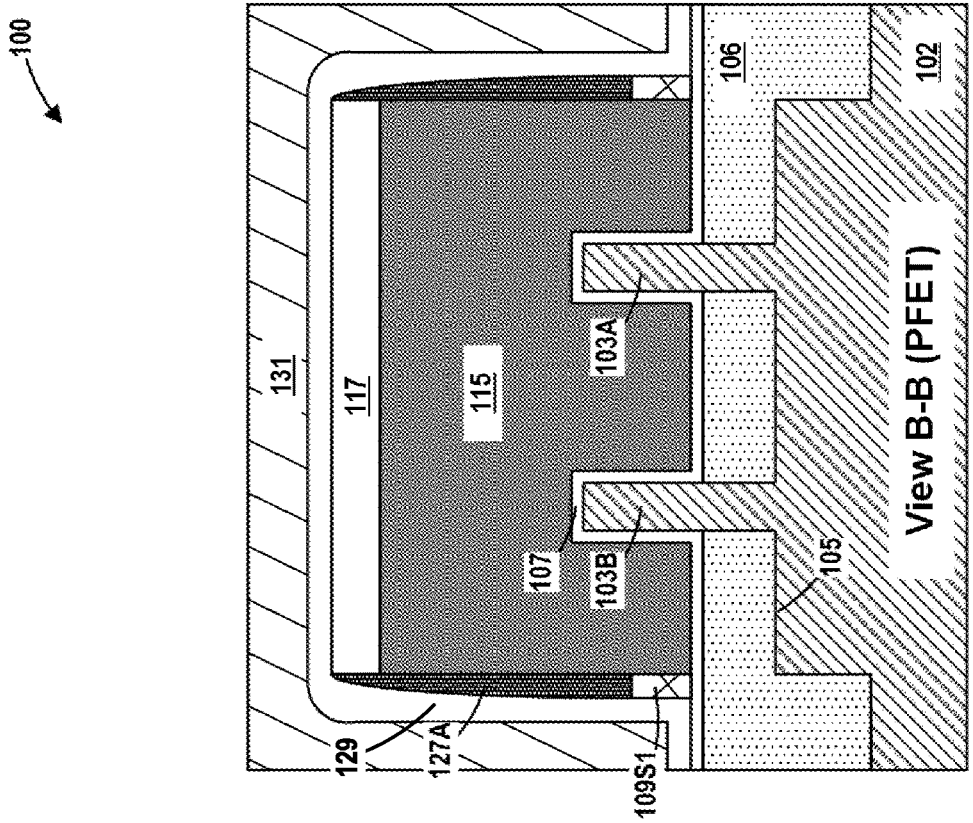
Figure 38:
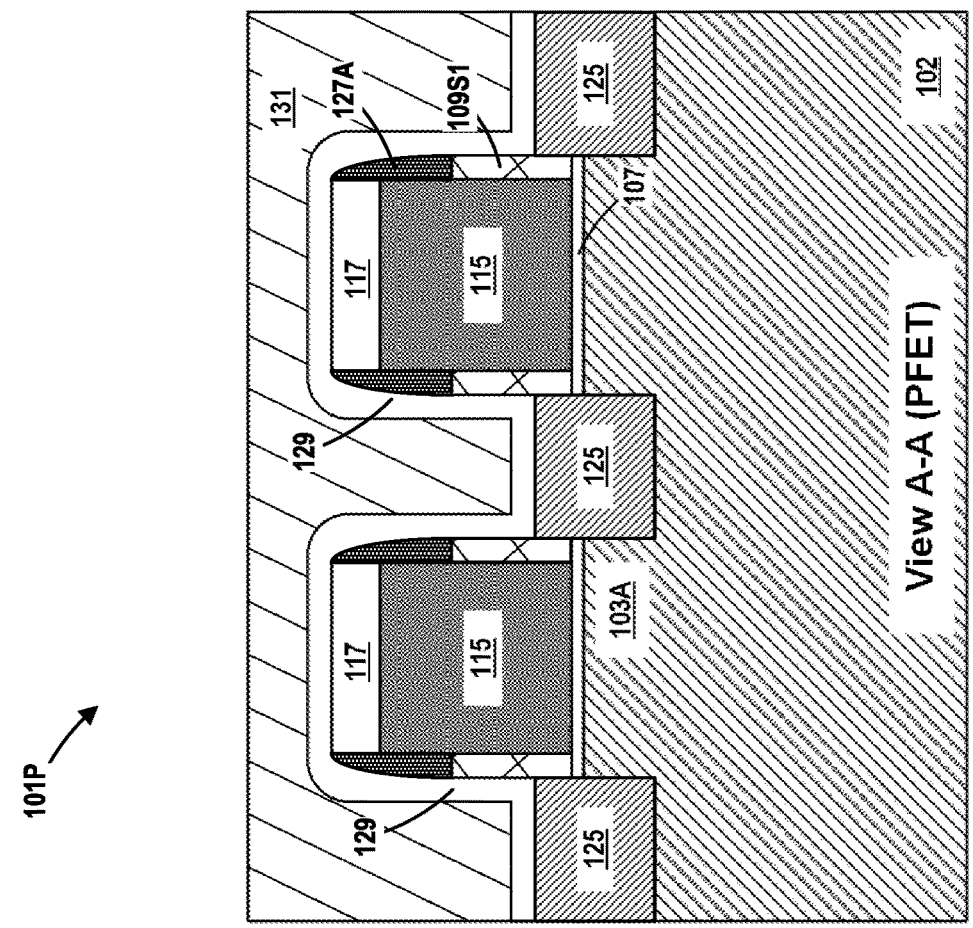
Figure 43:
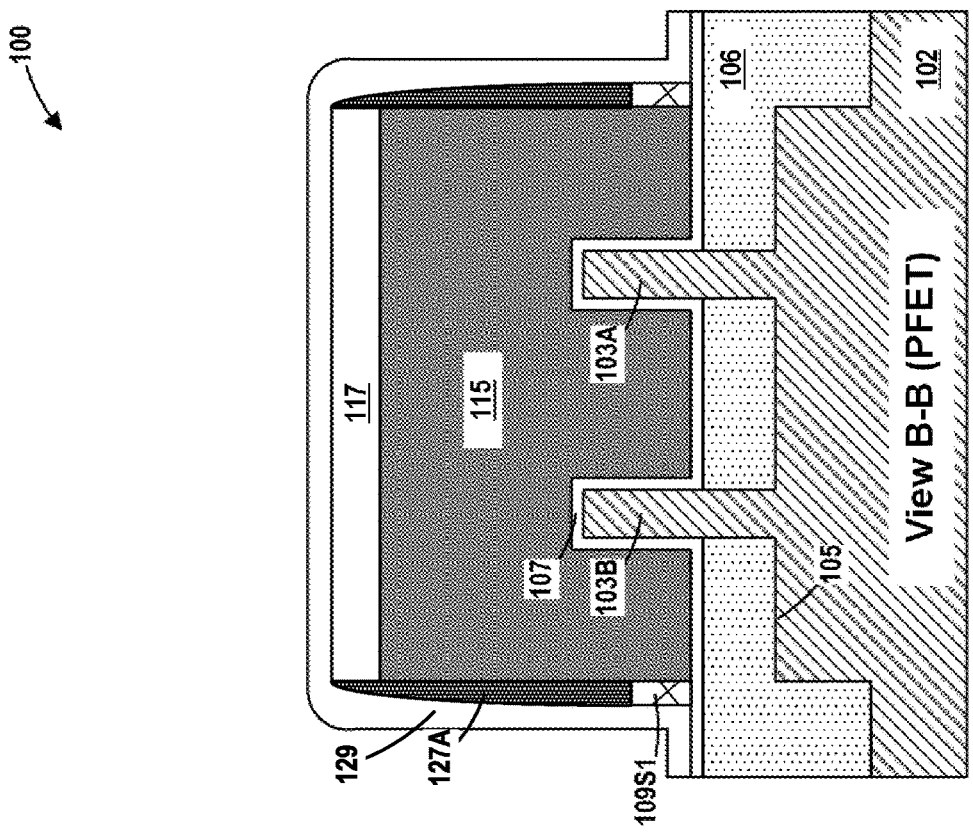
Figure 42:
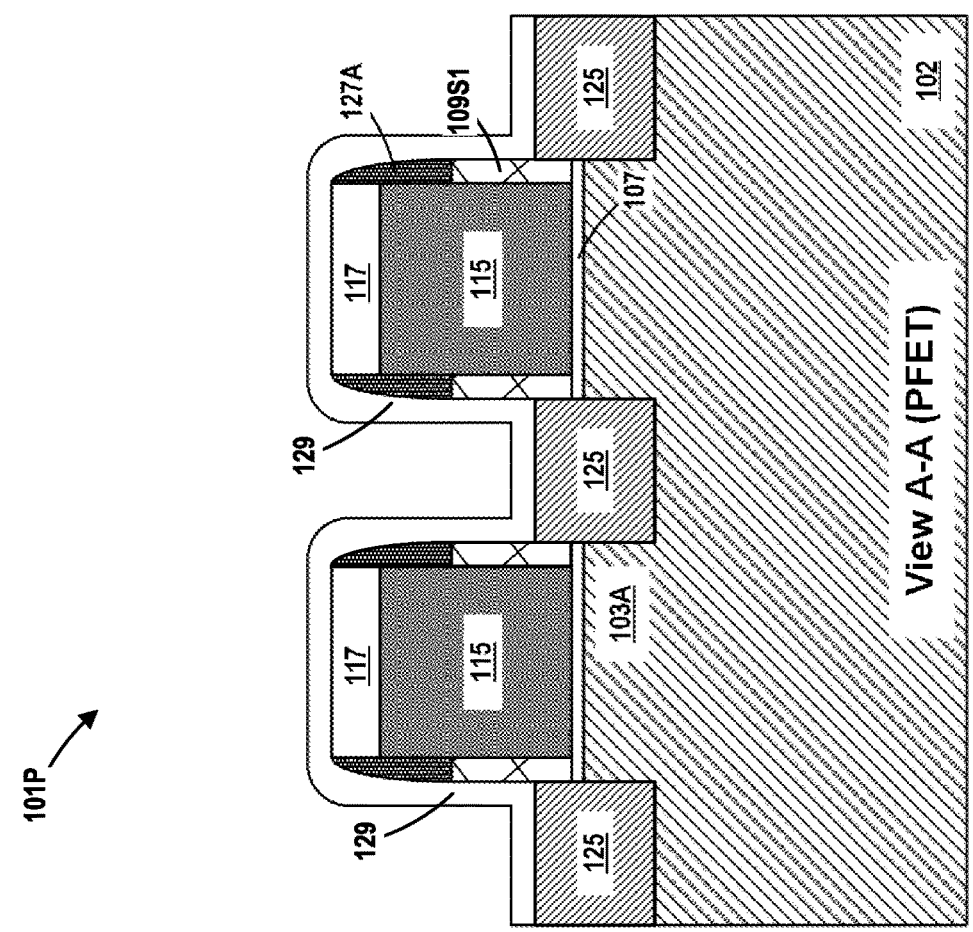
Figure 45:
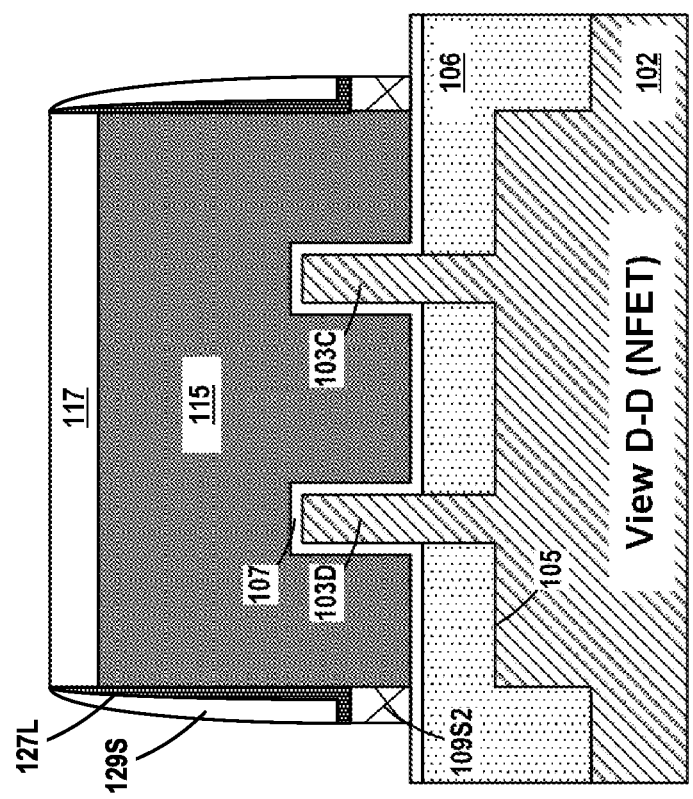
Figure 44:
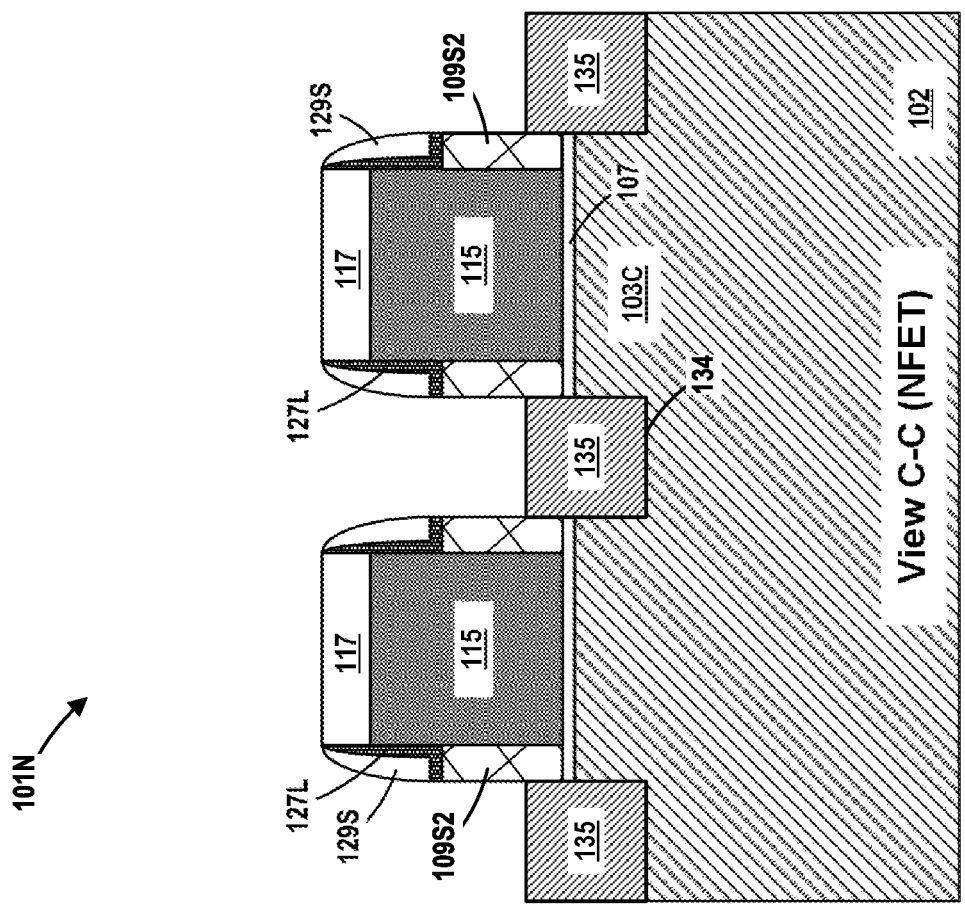
Figure 47:
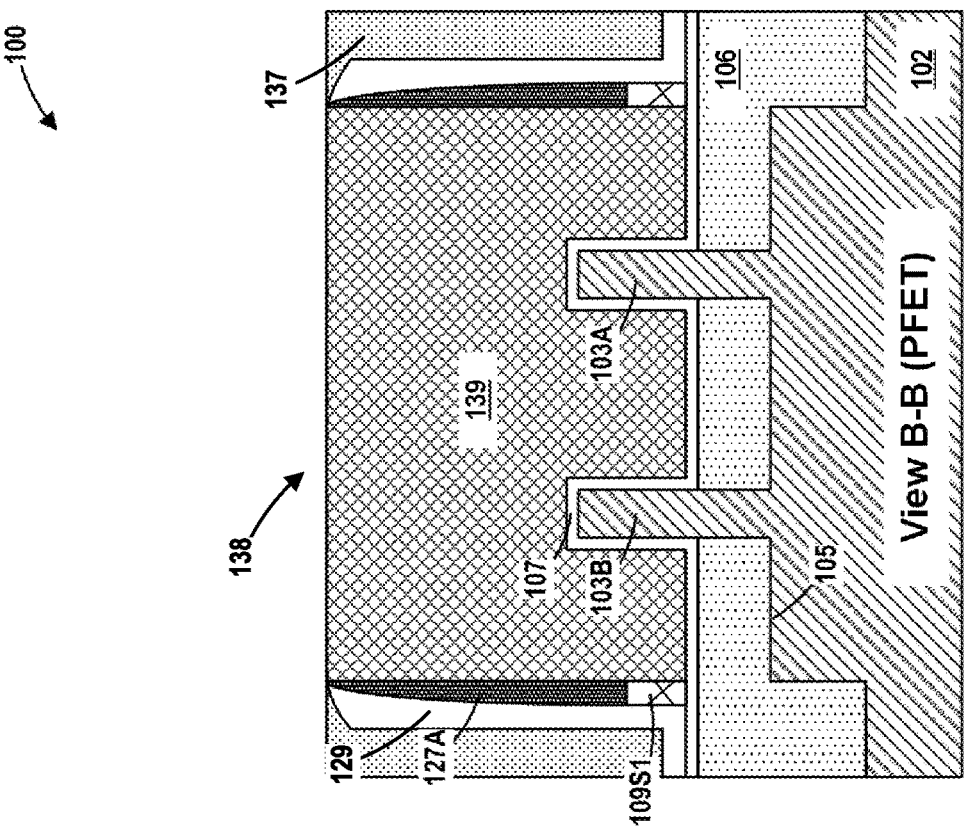
Figure 46:
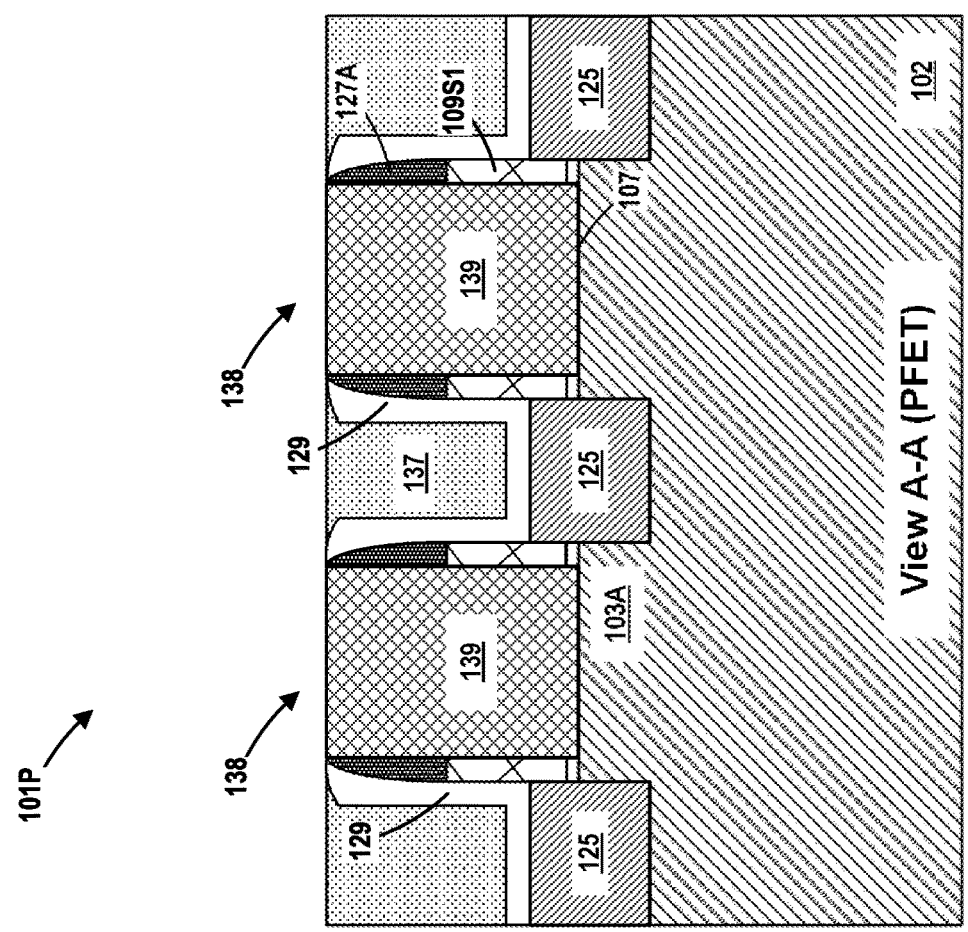
Figure 49:
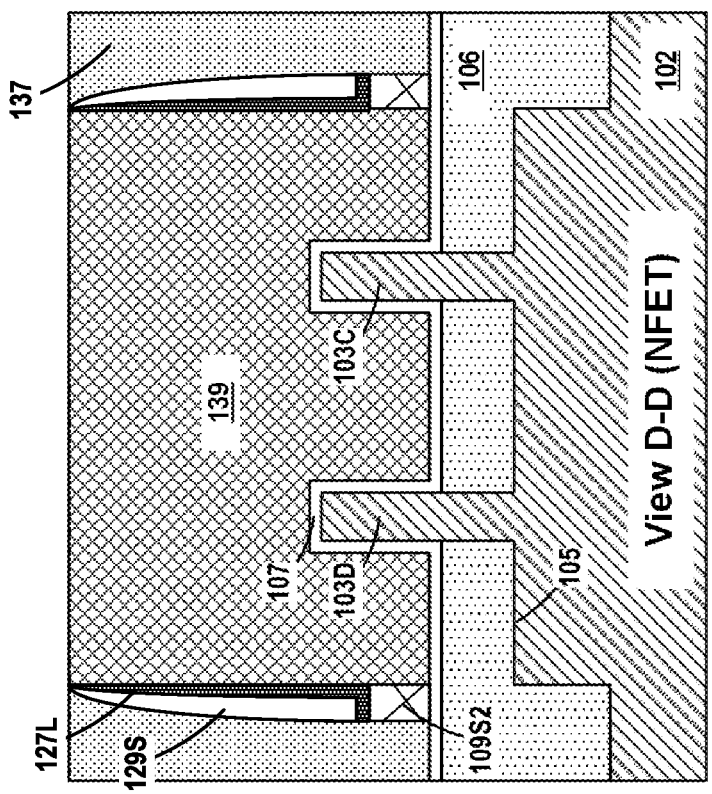
Figure 48:
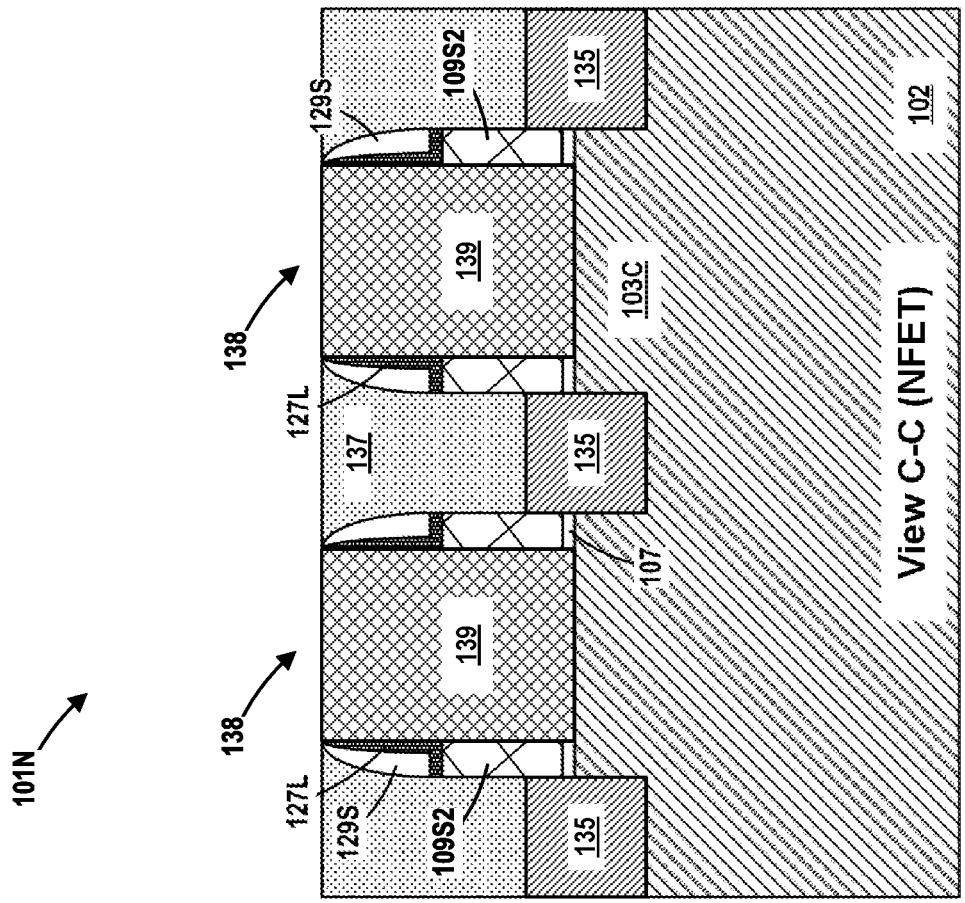
Figure 51:
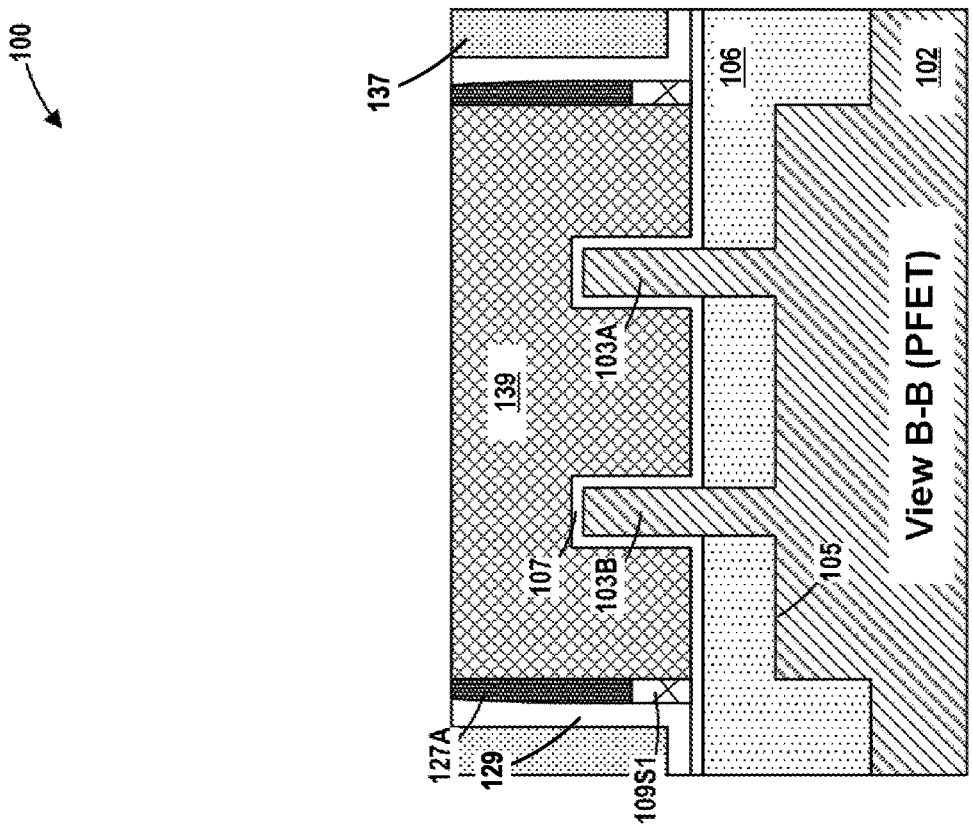
Figure 50:
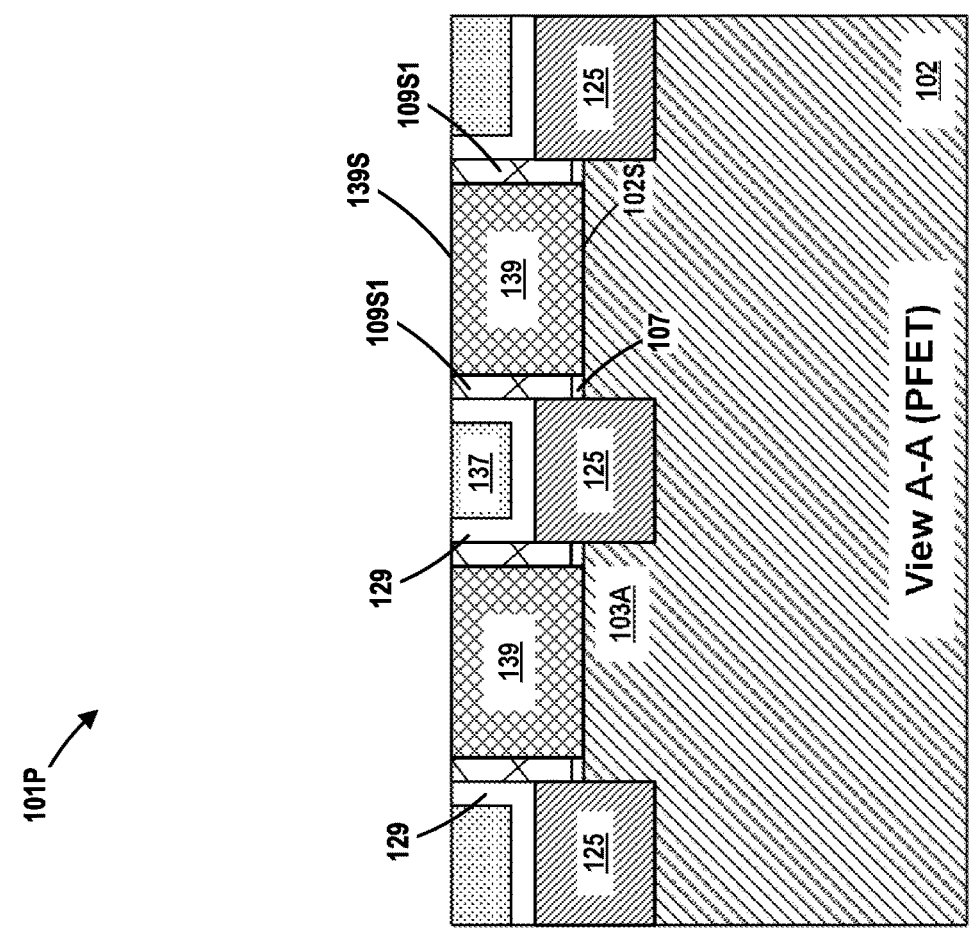
Figure 53:
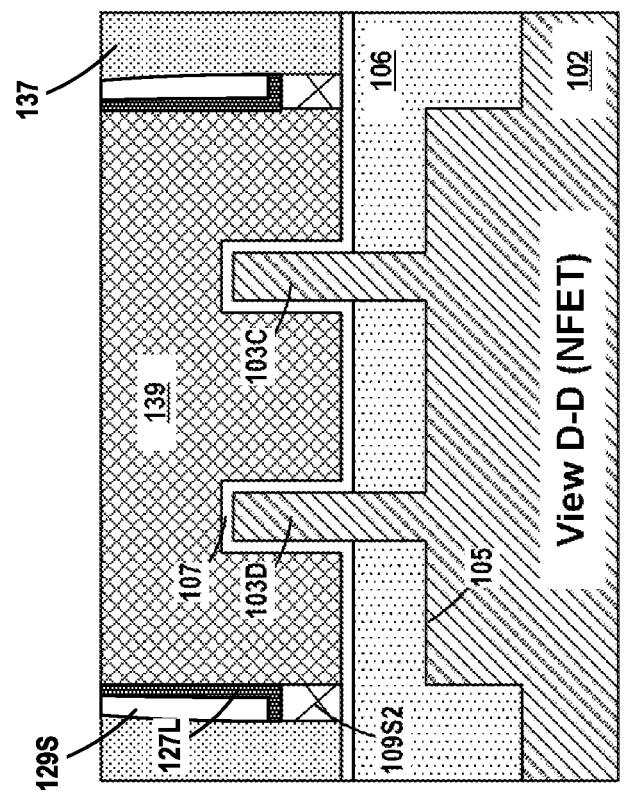
Figure 52:
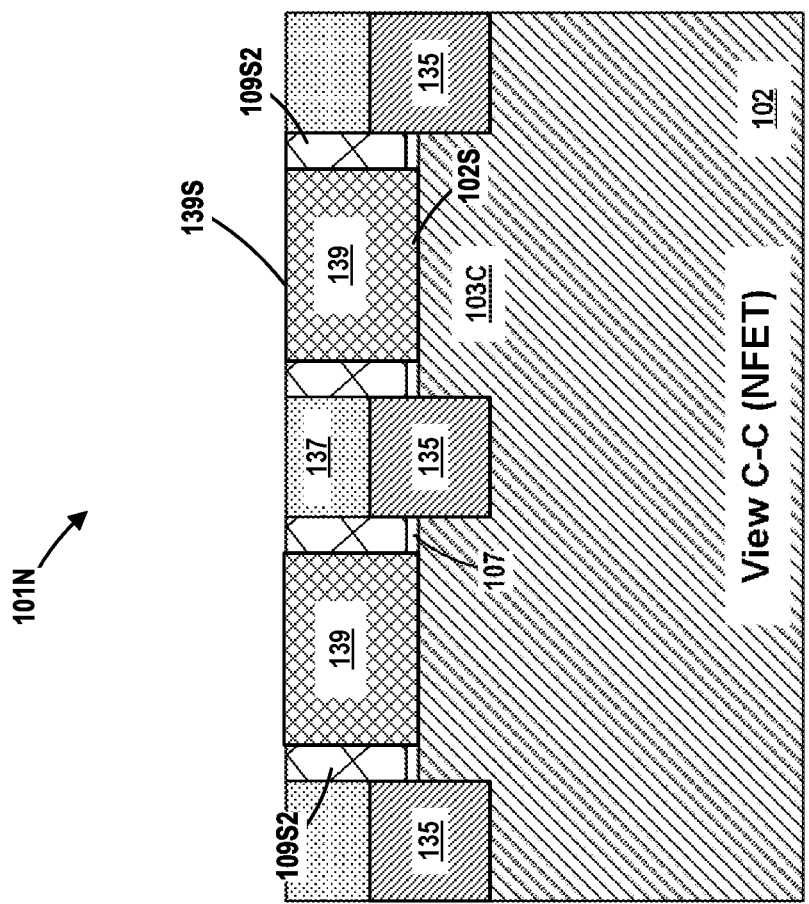
Figure 55:
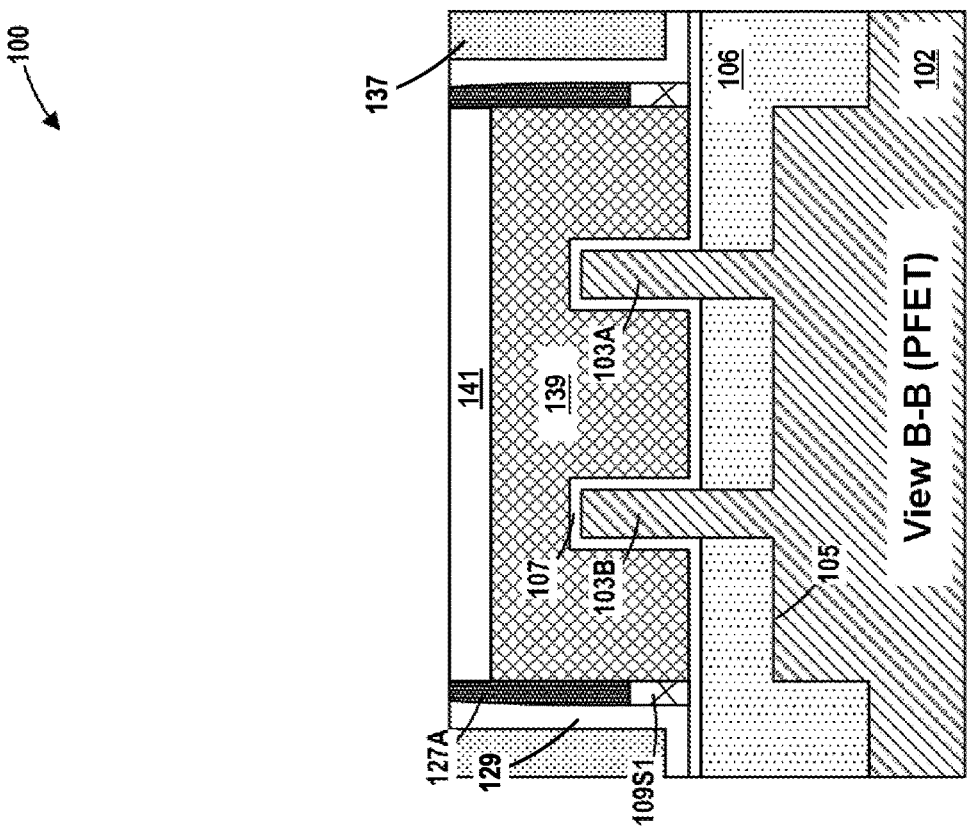
Figure 54:
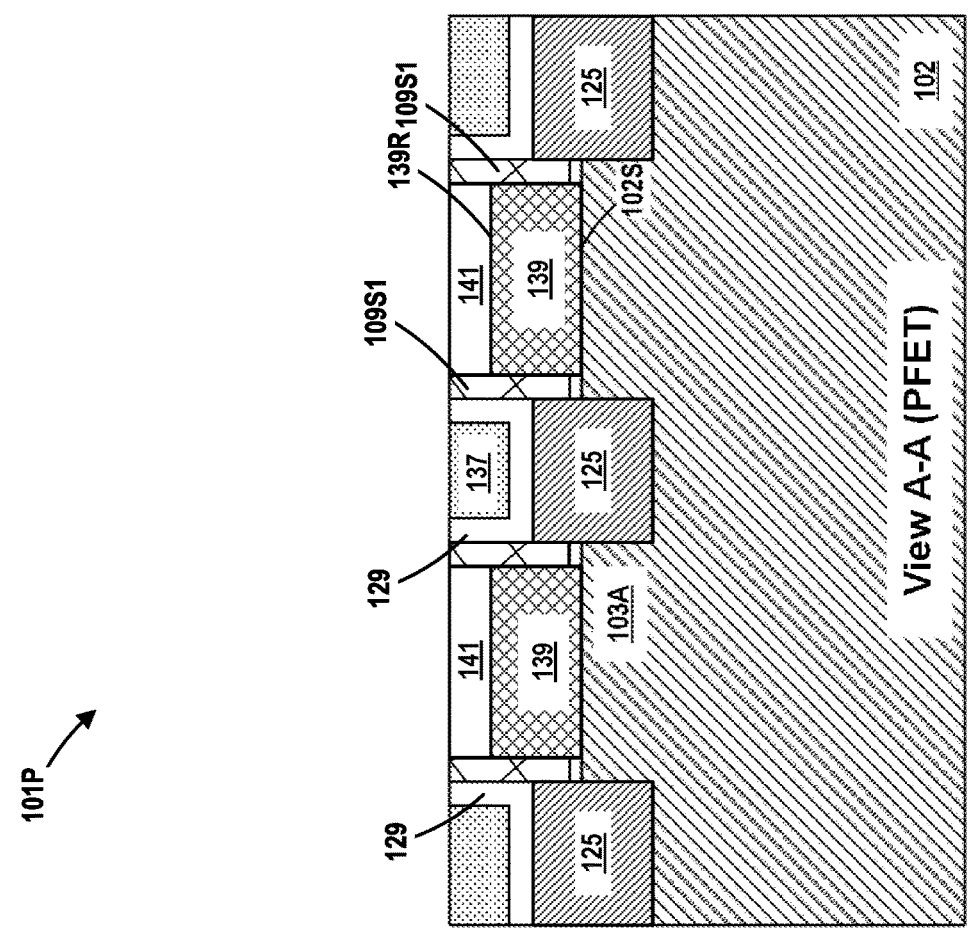
Figure 57:
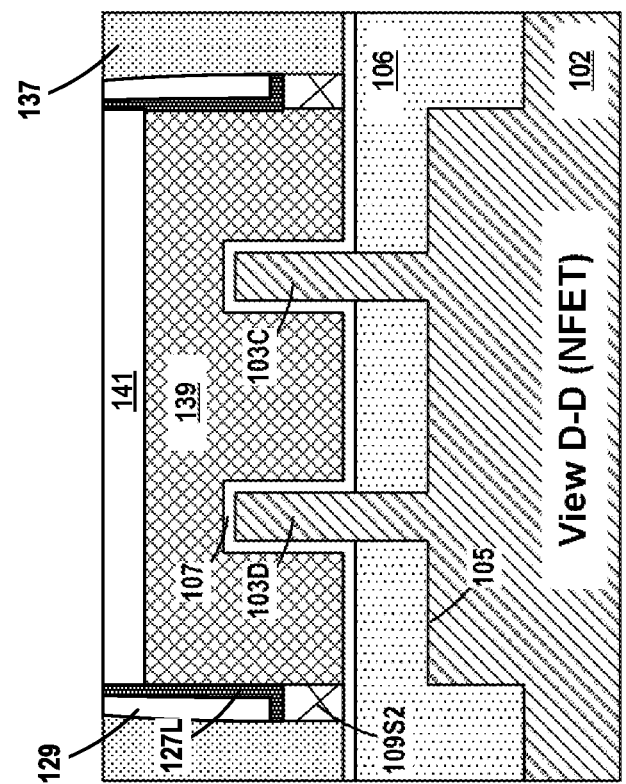
Figure 56:
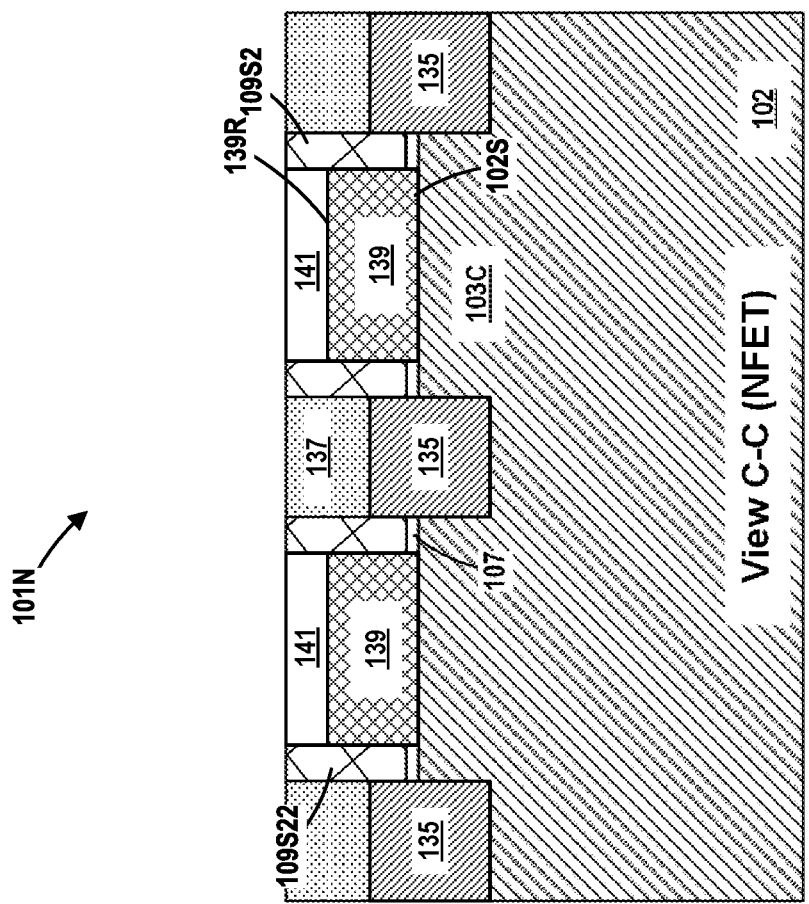

FIGS. 38-41 depict the IC product 100 after several process operations were performed. First, as shown in FIGS. 38-39, a patterned mask layer 131, e.g., a patterned layer of photoresist/BARC, was formed on the product 100 by performing traditional manufacturing techniques. The patterned mask layer 131, covers the PFET transistors 101P while leaving the NFET transistors 101N exposed for further processing. Next, as shown in FIGS. 40-41, an illustrative composite sidewall spacer structure 132 was formed adjacent the exposed sidewalls of the sacrificial gate electrode 115 of the NFET transistors 101N and above (and in some cases on and in physical contact with) the layer of polish-stop material 109. The composite spacer structure 132 may be formed by performing one or more anisotropic etching processes on the layer of spacer material 129 and the liner layer 127. As depicted, these process operations result in the format of the composite spacer structure 132 that comprises the L-shaped liner 127L and the sidewall spacer 129S positioned on the L-shaped liner 127L. The lateral width of the composite spacer structure 132 (in the gate length direction of the NFET transistors 101N) at the base of the composite spacer structure 132 may vary depending upon the particular application, e.g., 2-50 nm.

Thereafter, with continued reference to FIGS. 38-41, an anisotropic etching process was performed to remove exposed portions of the layer of polish-stop material 109 wherein the composite spacer structure 132 acts as an etch mask. This process operation exposes the sacrificial gate insulation layer 107 and results in the formation of a polish-stop sidewall spacer 109S2 positioned adjacent the sidewalls of a lower portion of the sacrificial gate electrode 115 of the NFET transistors 101N. The lateral width of the composite spacer structure 132 (in the gate length direction of the devices 101) at the base of the composite spacer structure 132 substantially defines the lateral width of the polish-stop sidewall spacer 109S2 (in the gate length direction of the devices 101). This process operation results in the formation of an overall composite spacer structure 133 that comprises the composite spacer structure 132 and the polish-stop sidewall spacer 109S2, wherein the composite spacer structure 132 is positioned above (or in some cases on and in physical contact with) the polish-stop sidewall spacer 109S2. Given the nature of the process performed to form the polish-stop sidewall spacer 109S2, at a location above the upper surface of the substrate 102 (e.g., above the upper surface of the fin 103 in the case of a FinFET device or above a planar upper surface of a substrate for a planar transistor device), the polish-stop sidewall spacer 109S2, when viewed in a cross-section taken through the polish-stop sidewall spacer 109S2 in a direction corresponding to the gate length direction of the devices 101, may have a substantially rectangular configuration. That is, the polish-stop sidewall spacer 109S2, at a location above the upper surface of the substrate 102, may have a substantially uniform width 109W2 throughout substantially an entire vertical height 109H2 of the polish-stop sidewall spacer 109S2. In some applications, the width 109W2 may range from about 2-50 nm and the vertical height 109H2 may range from about 5-100 nm. The above-referenced regions of polish-stop material 109T could also be formed at the same time the etching process was performed to form the polish-stop sidewall spacer 109S2.

FIGS. 42-45 depict the IC product 100 after several process operations were performed. First, the patterned mask layer 131 was removed from the PFET transistors 101P. Then, known manufacturing techniques were performed to form epi cavities 134 in the substrate 102 in the source/drain regions of the NFET transistors 101N. Next, known manufacturing techniques were performed to form epi semiconductor material 135 in the epi cavities 134. The source/drain epi semiconductor material 135 for the NFET transistors 101N may be comprised of a variety of different materials, e.g., silicon (Si), silicon phosphorus, etc.

FIGS. 46-49 depict the IC product 100 after several process operations were performed that ultimately result in the formation of illustrative and simplistically depicted replacement or final gate structures 139 for the devices 101. The final gate structures 139 are intended to be representative in nature of any type of gate structure that may be employed in manufacturing integrated circuit products using replacement-gate manufacturing techniques. Of course, the final gate structure 139 for the PFET transistors 101P may contain different materials, e.g., different work function materials, than the final gate structure 139 for the NFET transistors 101N. In general, the final gate structures 139 may comprise one or more gate insulation layers (not separately shown), such as, for example, silicon dioxide, a so-called high-k (k greater than 10) insulation material, etc., and one or more conductive material layers (not separately shown) that act as the gate electrode, e.g., a metal, a metal alloy, titanium nitride, tantalum nitride, tungsten, aluminum, polysilicon, etc.

Still referencing FIGS. 46-49, a layer of insulating material 137 was deposited on the product 100 so as to overfill the spaces above the regions of epi semiconductor material 125, 135 and such that the as-deposited upper surface of the layer of insulating material 137 is positioned above the upper surface of the sacrificial gate caps 117. Thereafter, one or more CMP process operations were then performed to remove the sacrificial gate caps 117 (and other materials) relative to a layer of insulating material 137 so as to expose the sacrificial gate electrodes 115 for further processing. Next, one or more etching processes were performed to remove the sacrificial gate electrodes 115 and the sacrificial gate insulation layer 107 in the space between the spacer structure 123 (FIG. 26) and the spacer structure 133 (FIG. 40) so as to form a replacement gate cavity 138 for each of the devices 101 between the spacer structures 123, 133.

Still referencing FIGS. 46-49, several deposition processes were performed to form the materials of the final gate structures 139 in the replacement gate cavities 138. For example, a conformal chemical vapor deposition (CVD) or atomic layer deposition (ALD) process may be performed to conformably deposit a gate insulation layer comprised of a high-k layer of insulating material, e.g., hafnium oxide, in the gate cavities 138. Thereafter, one or more metal or metal alloy layers and/or polysilicon layers (that will become the gate electrode) may be deposited in the gate cavities 138 above the gate insulation layer. One or more CMP process operations may then be performed to remove excess portions of the deposited layers of material for the final gate structures 139 that are positioned outside the gate cavities 138. These operations result in the schematically depicted final gate structures 139. Note that, in one embodiment, the composite spacer structure 123 and the overall composite spacer structure 133 are positioned on and in physical contact with the sidewalls of their associated final gate structures.

FIGS. 50-53 depict the IC product 100 after one or more CMP process operations were performed to reduce the vertical height of the final gate structures 139 using the polish-stop spacers 109S1 and 109S2 as a final polish stop. If present on the IC product 100, the regions of polish-stop material 109T may also act as a final polish stop. In the depicted example, at this point in the process flow, the upper surface of the final gate structures 139 is substantially coplanar with the upper surface of the polish-stop spacers 109S1 and 109S2 (and the regions of polish-stop material 109T if present). At this point in the process flow, at a location above the upper surface of the substrate 102 (e.g., above the upper surface of the fin 103 in the case of a FinFET device or above a planar upper surface of a substrate for a planar transistor device), the upper surface 139S of the final gate structures 139 may be about 5-100 nm above the upper surface 102S of the substrate 102, based upon current-day technology. As will be appreciated by those skilled in the art after a complete reading of the present application, reducing the vertical height of the final gate structures 139 will result in a reduction of the parasitic gate to source/drain capacitance and thereby result in improved performance of the resulting devices 101. Additionally, the methods and structures disclosed herein can lead to more uniform gate height across the substrate 102 and reduce or eliminate the problems associated with variations of CMP process operations in terms of controlling the final vertical height of the final gate structures 139. As will be appreciated by those skilled in the art after a complete reading of the present application, at least some CMP process operations performed to remove the materials of the gate structures 139 are timed operations without an effective polish-stop material positioned adjacent the gate structure to effectively control the final gate height of the final gate structures 139. Typically, silicon dioxide, a common ILD, has a significantly higher removal rate as compared to SiCN or SiN. The unique selectivity of the materials during polishing operations (relative to silicon dioxide) make these materials effective polish-stop materials that can promote more uniform gate heights across a substrate and thereby improve device performance.

Although the steps shown in FIGS. 46-49 and in FIGS. 50-53 are depicted as being separate steps, in practice, they may be performed as a substantially continuous one or more CMP process operations until such time as the CMP process stops on the polish-stop sidewall spacers 109S1 and 109S2 (and, if present, the regions of polish-stop material 109). More specifically, after the materials for the final gate structures 139 are deposited in the replacement gate cavities 128 and above the upper surface of the layer of insulating material 137 (as described in the discussion about FIGS. 46-49), then one or more CMP process operations may be performed to remove the materials of the final gate structures 139 positioned outside of the replacement gate cavities 138 and to thereafter reduce the height of the materials of the final gate structures 139 to the height shown in FIGS. 50-53.

In one illustrative process flow, at the point of processing depicted in FIGS. 50-53, a layer of insulating material (not shown), e.g., a gate capping layer of silicon nitride, SiCN, etc., may be deposited above the final gate structures 139 and the recessed layer of insulating material 137. At that point, one or more etching processes may be performed through a patterned etch mask (not shown) to form openings that expose the regions of epi semiconductor materials 125, 135 on the devices 101. Then, known manufacturing techniques may be performed to form conductive source/drain metallization structures (not shown) so as to conductively contact the regions of epi semiconductor materials 125, 135. At that point, the above-described source-drain metallization structure may be formed by performing known manufacturing techniques.

In another illustrative process flow, and with reference to FIGS. 54-57, after the processing depicted in FIGS. 50-53, final gate caps 141 were formed above the final gate structures 139. More specifically, a timed, recess etching process was performed to recess the final gate structures 139 shown in FIGS. 50-53 so as to thereby make room for the final gate caps 141 to be formed in the replacement gate cavities 138 above the recessed final gate structures 139. The final gate caps 141 were formed by depositing a layer of gate cap material, e.g., silicon nitride, SiCN, etc., across the substrate and thereafter performing a CMP process to remove the excess gate cap material positioned above the layer of insulating material 137. In this embodiment, the recessed upper surface 139R of the final gate structures 139 may be about 2-10 nm above the upper surface 102S of the substrate 102, based upon current-day technology. At that point, the above-described source-drain metallization structure may be formed by performing known manufacturing techniques.

In the examples above, the polish-stop spacer 109S1 was formed on the PFET transistors 101P prior to the formation of the polish-stop spacer 109S2 on the NEFT devices 101N. However, as will be appreciated by those skilled in the art after a complete reading of the present application, the process flow could have been reversed. Stated another way, the processing steps performed on the PFET transistors 101P could have been performed on the NFET transistors 101N and vice-versa.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is there-fore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. An integrated circuit (IC) product, comprising:
   a semiconductor substrate comprising an upper surface;
   a first transistor device formed on the semiconductor substrate, the first transistor device comprising a first gate structure comprising an upper surface, a first gate width that extends in a first gate width direction, and a first gate length that extends in a first gate length direction; and
   a first spacer structure positioned adjacent the first gate structure, the first spacer structure including a first composite sidewall spacer positioned on a first polish-stop sidewall spacer, the first composite sidewall spacer including an L-shaped liner and a first sidewall spacer positioned on the L-shaped liner,
   wherein the first composite sidewall spacer and the first polish-stop sidewall spacer form a surface that is parallel to a first gate width surface,
   wherein at a location above the upper surface of the semiconductor substrate, when viewed in a cross-section taken through the first gate structure in a direction corresponding to the first gate width direction, an upper surface of the first composite sidewall spacer is substantially coplanar with the upper surface of the first gate structure and above the first polish-stop sidewall spacer relative to the upper surface of the semiconductor substrate.

2. The IC product of claim 1, wherein the first transistor device is one of a FinFET device or a planar device and wherein the first transistor device is an NFET device.

3. The IC product of claim 1, wherein, at a location above the upper surface of the semiconductor substrate, when viewed in a cross-section taken through the first spacer structure in a direction corresponding to the first gate length direction, the first spacer structure has a substantially uniform width in the first gate length direction for a substantial entirety of a vertical height of the first composite sidewall spacer.

4. The IC product of claim 1, further comprising:
   a second transistor device formed on the semiconductor substrate, the second transistor device comprising a second gate structure comprising an upper surface and a second gate length that extends in a second gate length direction; and
   a second spacer structure positioned adjacent the second gate structure, the second spacer structure including an upper spacer structure positioned on a second polish-stop sidewall spacer, the upper spacer structure having an upper surface, wherein, at a location above the upper surface of the semiconductor substrate, when viewed in a cross-section taken through the second spacer structure in a direction corresponding to the second gate length direction, the upper surface of the second gate structure is substantially coplanar with the upper surface of the second spacer structure, wherein the first polish-stop sidewall spacer comprises one of silicon carbon nitride (SiCN), SiBN or SiCNB and wherein the second polish-stop sidewall spacer comprises a same material as the first polish-stop sidewall spacer, wherein the upper spacer structure and the second polish-stop sidewall spacer form a surface that is parallel to a second gate width surface.

5. The IC product of claim 4, wherein the first spacer structure is positioned on and in contact with the first gate structure and wherein the second spacer structure is positioned on and in contact with the second gate structure.

6. The IC product of claim 1, wherein the first polish-stop sidewall spacer comprises one of silicon carbon nitride (SiCN), SiBN or SiCNB.

7. The IC product of claim 1, further comprising a region of polish-stop material positioned above a dummy region on the semiconductor substrate, the dummy region being free of any transistor devices, wherein an upper surface of the region of polish-stop material is substantially coplanar with the upper surface of the first polish-stop sidewall spacer and wherein the region of polish-stop material and the first polish-stop sidewall spacer comprise a same material.

8. The IC product of claim 1, wherein the first spacer structure is positioned on and in contact with the first gate structure.

9. An integrated circuit (IC) product, comprising:
a semiconductor substrate comprising an upper surface;
a first transistor device formed on the semiconductor substrate, the first transistor device comprising a first gate structure comprising an upper surface, a first gate length that extends in a first gate length direction and a first gate width that extends in a first gate width direction;
a second transistor device formed on the semiconductor substrate, the second transistor device comprising a second gate structure comprising an upper surface, a second gate length that extends in a second gate length direction and a second gate width that extends in a second gate width direction;
a first spacer structure positioned adjacent the first gate structure, the first spacer structure comprising a first polish-stop sidewall spacer and a first sidewall spacer positioned on the first polish-stop sidewall spacer, the first polish-stop sidewall spacer comprising a first material, wherein, at a location above the upper surface of the semiconductor substrate, when viewed in a cross-section taken through the first spacer structure in a direction corresponding to the first gate length direction, the upper surface of the first gate structure is substantially coplanar with an upper surface of the first spacer structure, wherein the first polish-stop sidewall spacer and the first sidewall spacer form a surface that is parallel to a first gate width surface; and a second spacer structure positioned adjacent the second gate structure, the second spacer structure comprising a second polish-stop sidewall spacer and a first composite sidewall spacer positioned on the second polish-stop sidewall spacer, the first composite sidewall spacer comprising an L-shaped liner and a second sidewall spacer positioned on the L-shaped liner, the second polish-stop sidewall spacer comprising the first material, wherein at a location above the upper surface of the semiconductor substrate, when viewed in a cross-section taken through the second spacer structure in a direction corresponding to the second gate length direction, the upper surface of the second gate structure is substantially coplanar with an upper surface of the second spacer structure, wherein at a location above the upper surface of the semiconductor substrate, when viewed in a cross-section taken through the second gate structure in a direction corresponding to a second gate width direction, an upper surface of the first composite sidewall spacer is substantially coplanar with the upper surface of the second gate structure and above the second polish-stop sidewall spacer relative to the upper surface of the semiconductor substrate, wherein the second polish-stop sidewall spacer and the first composite sidewall spacer form a surface that is parallel to a second gate width surface.

10. The IC product of claim 9, wherein the first material comprises one of silicon carbon nitride (SiCN), SiBN or SiCNB.

11. The IC product of claim 9, wherein, at a location above the upper surface of the semiconductor substrate, when viewed in a cross-section taken through the first spacer structure in a direction corresponding to the first gate length direction, the first spacer structure has a substantially uniform width in the first gate length direction for a substantial entirety of a vertical height of the first spacer structure and wherein, at a location above the upper surface of the semiconductor substrate, when viewed in a cross-section taken through the second spacer structure in a direction corresponding to the second gate length direction, the second spacer structure has a substantially uniform width in the second gate length direction for a substantial entirety of a vertical height of the second polish-stop sidewall spacer.

12. The IC product of claim 9, wherein the first spacer structure is positioned on and in contact with the first gate structure and wherein the second polish-stop sidewall spacer is positioned on and in contact with the second gate structure.

13. The IC product of claim 9, further comprising a region of the first material positioned above a dummy region on the semiconductor substrate, the dummy region being free of any transistor devices, wherein an upper surface of the region of the first material is substantially coplanar with the upper surface of the first spacer structure.

14. The IC product of claim 13, wherein the upper surface of the region of the first material is substantially coplanar with the upper surface of the second spacer structure.

* * * * *